(12) United States Patent
Rice et al.

(10) Patent No.: US 12,094,752 B2
(45) Date of Patent: *Sep. 17, 2024

(54) WAFER EDGE RING LIFTING SOLUTION

(71) Applicant: Applied Materials, Inc., Santa Clara, CA (US)

(72) Inventors: Michael R. Rice, Pleasanton, CA (US); Yogananda Sarode Vishwanath, Bangalore (IN); Sunil Srinivasan, San Jose, CA (US); Rajinder Dhindsa, Pleasanton, CA (US); Steven E. Babayan, Los Altos, CA (US); Olivier Luere, Sunnyvale, CA (US); Denis M. Koosau, Pleasanton, CA (US); Imad Yousif, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/843,652

(22) Filed: Jun. 17, 2022

(65) Prior Publication Data

US 2022/0319904 A1 Oct. 6, 2022

Related U.S. Application Data

(63) Continuation of application No. 15/399,809, filed on Jan. 6, 2017, now Pat. No. 11,393,710.

(Continued)

(30) Foreign Application Priority Data

Jun. 2, 2016 (IN) .............................. 201641019009

(51) Int. Cl.
*H01J 37/32* (2006.01)
*H01L 21/67* (2006.01)
(Continued)

(52) U.S. Cl.
CPC .. *H01L 21/68735* (2013.01); *H01J 37/32082* (2013.01); *H01J 37/32091* (2013.01);
(Continued)

(58) Field of Classification Search
CPC ......... H01L 21/68735; H01L 21/68742; H01L 21/6831; H01L 21/67017; H01L 21/6719;
(Continued)

(56) References Cited

U.S. PATENT DOCUMENTS 5,267,607 A 12/1993 Wada
5,660,673 A 8/1997 Miyoshi
(Continued)

FOREIGN PATENT DOCUMENTS

CN 203895409 U 10/2014
CN 105336561 A 2/2016
(Continued)

OTHER PUBLICATIONS

Office Action for Chinese Patent Application No. 201680067775.8 dated Jun. 17, 2022.
(Continued)

*Primary Examiner* — Charlee J. C. Bennett
(74) *Attorney, Agent, or Firm* — Patterson + Sheridan, LLP

(57) ABSTRACT

Apparatuses including a height-adjustable edge ring, and methods for use thereof are described herein. In one example, a process kit for processing a substrate is provided. The process kit has a support ring comprising an upper surface having an inner edge disposed at a first height and an outward edge disposed at a second height less than the first height, the inner edge having a greater thickness than the outward edge. An edge ring is disposed on the support ring, an inner surface of the edge ring interfaced with the inner edge of the support ring. A cover ring is disposed outward (Continued)

of the edge ring, the edge ring independently moveable relative to the support ring and the cover ring. Push pins are disposed inward of the cover ring, the push pins operable to elevate the edge ring while constraining radial movement of the support ring.

10 Claims, 14 Drawing Sheets

Related U.S. Application Data

(60) Provisional application No. 62/287,038, filed on Jan. 26, 2016.

(51) Int. Cl.
*H01L 21/683* (2006.01)
*H01L 21/687* (2006.01)

(52) U.S. Cl.
CPC .. *H01J 37/32715* (2013.01); *H01L 21/67017* (2013.01); *H01L 21/6719* (2013.01); *H01L 21/6831* (2013.01); *H01L 21/68742* (2013.01); *H01J 2237/334* (2013.01)

(58) Field of Classification Search
CPC ........... H01J 37/32715; H01J 37/32091; H01J 37/32082; H01J 2237/334
USPC .................................................... 156/345.51
See application file for complete search history.

(56) References Cited

U.S. PATENT DOCUMENTS

| | | | |
|---|---|---|---|
| 5,730,801 A | 3/1998 | Tepman et al. | |
| 5,748,434 A * | 5/1998 | Rossman | H01L 21/6833 361/234 |
| 5,762,714 A | 6/1998 | Mohn et al. | |
| 5,851,140 A | 12/1998 | Barns et al. | |
| 5,885,428 A | 3/1999 | Kogan | |
| 6,022,809 A | 2/2000 | Fan | |
| 6,044,534 A | 4/2000 | Seo et al. | |
| 6,206,976 B1 | 3/2001 | Crevasse et al. | |
| 6,375,748 B1 | 4/2002 | Yudovsky et al. | |
| 6,391,787 B1 | 5/2002 | Dhindsa et al. | |
| 6,511,543 B1 | 1/2003 | Stauss et al. | |
| 6,589,352 B1 | 7/2003 | Yudovsky et al. | |
| 6,676,759 B1 | 1/2004 | Takagi | |
| 6,709,547 B1 | 3/2004 | Ni et al. | |
| 6,744,212 B2 | 6/2004 | Fischer et al. | |
| 6,773,562 B1 | 8/2004 | Inagawa et al. | |
| 6,896,765 B2 | 5/2005 | Steger | |
| 6,898,558 B2 | 5/2005 | Klekotka | |
| 7,138,014 B2 | 11/2006 | Stevens et al. | |
| 7,138,067 B2 | 11/2006 | Vahedi et al. | |
| 7,176,403 B2 | 2/2007 | Steger | |
| 7,252,738 B2 | 8/2007 | Tong et al. | |
| 7,311,784 B2 | 12/2007 | Fink | |
| 7,338,578 B2 | 3/2008 | Huang et al. | |
| 7,589,950 B2 | 9/2009 | Parkhe et al. | |
| 7,824,146 B2 | 11/2010 | Lanee et al. | |
| 7,968,469 B2 | 6/2011 | Collins et al. | |
| 8,270,141 B2 | 9/2012 | Willwerth et al. | |
| 8,298,371 B2 | 10/2012 | Koshimizu et al. | |
| 8,441,640 B2 | 5/2013 | Patalay et al. | |
| 8,696,878 B2 | 4/2014 | Riker et al. | |
| 8,900,398 B2 | 12/2014 | Dhindsa et al. | |
| 8,933,628 B2 | 1/2015 | Banna et al. | |
| 8,988,848 B2 | 3/2015 | Todorow et al. | |
| 8,999,106 B2 | 4/2015 | Liu et al. | |
| 9,011,637 B2 | 4/2015 | Yamamoto | |
| 9,017,526 B2 | 4/2015 | Singh et al. | |
| 9,076,636 B2 | 7/2015 | Ohata et al. | |
| 9,142,391 B2 | 9/2015 | Yamamoto | |
| 9,287,093 B2 | 3/2016 | Singh et al. | |
| 9,410,249 B2 | 8/2016 | Male et al. | |
| 9,583,357 B1 | 2/2017 | Long et al. | |
| 9,601,319 B1 | 3/2017 | Bravo et al. | |
| 9,620,376 B2 | 4/2017 | Kamp et al. | |
| 9,761,459 B2 | 9/2017 | Long et al. | |
| 9,852,889 B1 | 12/2017 | Kellogg et al. | |
| 9,881,820 B2 | 1/2018 | Wong et al. | |
| 9,947,517 B1 | 4/2018 | Luere et al. | |
| 10,103,010 B2 | 10/2018 | Luere et al. | |
| 10,504,702 B2 | 12/2019 | Luere et al. | |
| 10,553,404 B2 | 2/2020 | Luere et al. | |
| 10,600,623 B2 | 3/2020 | Sarode Vishwanath | |
| 10,790,123 B2 | 9/2020 | Sarode Vishwanath | |
| 10,991,556 B2 | 4/2021 | Luere et al. | |
| 11,393,710 B2 * | 7/2022 | Rice | H01J 37/32082 |
| 2003/0173031 A1 | 9/2003 | Aggarwal et al. | |
| 2003/0201069 A1 | 10/2003 | Johnson | |
| 2004/0053428 A1 | 3/2004 | Steger | |
| 2004/0149389 A1 | 8/2004 | Fink | |
| 2004/0261946 A1 | 12/2004 | Endoh et al. | |
| 2005/0061447 A1 | 3/2005 | Kim et al. | |
| 2005/0133164 A1 | 6/2005 | Fischer et al. | |
| 2005/0263070 A1 | 12/2005 | Fink | |
| 2007/0131253 A1 | 6/2007 | Nakamura et al. | |
| 2008/0066868 A1 | 3/2008 | Masuda | |
| 2008/0173237 A1 | 7/2008 | Collins et al. | |
| 2008/0236749 A1 * | 10/2008 | Koshimizu | H01J 37/32348 156/345.33 |
| 2008/0289766 A1 | 11/2008 | Heemstra et al. | |
| 2009/0041568 A1 * | 2/2009 | Muraoka | H01L 21/68742 414/586 |
| 2009/0044751 A1 * | 2/2009 | Park | H01J 37/32495 118/723 R |
| 2009/0067954 A1 | 3/2009 | Lanee et al. | |
| 2009/0220865 A1 * | 9/2009 | Ouye | H01J 37/3266 430/5 |
| 2010/0101729 A1 | 4/2010 | Kim et al. | |
| 2010/0196625 A1 | 8/2010 | Yoon et al. | |
| 2010/0206484 A1 | 8/2010 | Hiromi et al. | |
| 2011/0011534 A1 | 1/2011 | Dhindsa | |
| 2011/0031111 A1 | 2/2011 | Kobayashi | |
| 2011/0157760 A1 | 6/2011 | Willwerth et al. | |
| 2011/0287631 A1 | 11/2011 | Yamamoto | |
| 2012/0052599 A1 | 3/2012 | Brouk et al. | |
| 2012/0091108 A1 | 4/2012 | Lin et al. | |
| 2012/0175063 A1 * | 7/2012 | Yamawaku | H01L 21/67069 156/345.46 |
| 2012/0176692 A1 | 7/2012 | Yamawaku et al. | |
| 2012/0256363 A1 | 10/2012 | Okita et al. | |
| 2012/0305184 A1 | 12/2012 | Singh et al. | |
| 2013/0093443 A1 | 4/2013 | Patrick | |
| 2013/0106286 A1 | 5/2013 | Banna et al. | |
| 2013/0155568 A1 | 6/2013 | Todorow et al. | |
| 2013/0228323 A1 * | 9/2013 | Makabe | H01L 21/67109 165/59 |
| 2014/0017900 A1 | 1/2014 | Doba et al. | |
| 2014/0213055 A1 | 7/2014 | Himori et al. | |
| 2014/0265089 A1 | 9/2014 | Tantiwong et al. | |
| 2015/0064809 A1 | 3/2015 | Lubomirsky | |
| 2015/0181684 A1 | 6/2015 | Banna et al. | |
| 2015/0200124 A1 | 7/2015 | Yamamoto | |
| 2015/0332951 A1 | 11/2015 | Male et al. | |
| 2016/0042926 A1 | 2/2016 | Ishikawa et al. | |
| 2016/0056017 A1 | 2/2016 | Kim et al. | |
| 2016/0211165 A1 | 7/2016 | McChesney et al. | |
| 2016/0211166 A1 | 7/2016 | Yan et al. | |
| 2016/0240415 A1 | 8/2016 | Sekiya | |
| 2017/0018411 A1 | 1/2017 | Sriraman et al. | |
| 2017/0069462 A1 | 3/2017 | Kanarik et al. | |
| 2017/0103870 A1 | 4/2017 | Marakhtanov et al. | |
| 2017/0110335 A1 | 4/2017 | Yang et al. | |
| 2017/0113355 A1 | 4/2017 | Genetti et al. | |
| 2017/0115657 A1 | 4/2017 | Trussell et al. | |
| 2017/0117170 A1 | 4/2017 | Wong et al. | |
| 2017/0117172 A1 * | 4/2017 | Genetti | H01L 21/68785 |
| 2017/0133283 A1 | 5/2017 | Kenworthy | |
| 2017/0178917 A1 | 6/2017 | Kamp et al. | |
| 2017/0213758 A1 | 7/2017 | Rice et al. | |

(56) References Cited

U.S. PATENT DOCUMENTS

| | | |
|---|---|---|
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0250056 A1 | 8/2017 | Boswell et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0316935 A1 | 11/2017 | Tan et al. |
| 2017/0330786 A1 | 11/2017 | Genetti et al. |
| 2017/0334074 A1 | 11/2017 | Genetti et al. |
| 2017/0372912 A1 | 12/2017 | Long et al. |
| 2018/0019107 A1 | 1/2018 | Ishizawa |
| 2018/0052104 A1 | 2/2018 | Larsson et al. |
| 2018/0061696 A1 | 3/2018 | D'Ambra et al. |
| 2018/0090354 A1 | 3/2018 | Sugita et al. |
| 2018/0166259 A1 | 6/2018 | Ueda |
| 2018/0204757 A1 | 7/2018 | Fushimi |
| 2018/0218933 A1* | 8/2018 | Luere ............... H01L 21/68742 |
| 2018/0233328 A1 | 8/2018 | Ueda et al. |
| 2018/0277416 A1 | 9/2018 | Takahashi et al. |
| 2018/0301322 A1 | 10/2018 | Sugita et al. |
| 2018/0308737 A1* | 10/2018 | Moriya ............. H01L 21/68742 |
| 2018/0315583 A1 | 11/2018 | Luere et al. |
| 2018/0315640 A1 | 11/2018 | Ueda et al. |
| 2018/0358211 A1* | 12/2018 | Mun .................. H01L 21/6831 |
| 2019/0013232 A1 | 1/2019 | Yan et al. |
| 2019/0088531 A1 | 3/2019 | Sarode Vishwanath et al. |
| 2019/0172688 A1 | 6/2019 | Ueda |
| 2019/0172714 A1 | 6/2019 | Bobek et al. |
| 2019/0318918 A1 | 10/2019 | Saitoh et al. |
| 2019/0333785 A1 | 10/2019 | Tanikawa |
| 2019/0362949 A1 | 11/2019 | Sarode Vishwanath |
| 2020/0020510 A1 | 1/2020 | Shoeb et al. |
| 2020/0234981 A1 | 7/2020 | Schmid et al. |

FOREIGN PATENT DOCUMENTS

| | | |
|---|---|---|
| CN | 105789010 A | 7/2016 |
| JP | 2000049144 A | 2/2000 |
| JP | 3020898 B2 | 3/2000 |
| JP | 2001230239 A | 8/2001 |
| JP | 2002176030 A | 6/2002 |
| JP | 2006186171 A | 7/2006 |
| JP | 2008078208 A | 4/2008 |
| JP | 2008244274 A | 10/2008 |
| JP | 2011054933 A | 3/2011 |
| JP | 2013511847 A | 4/2013 |
| JP | 2014019912 A | 2/2014 |
| JP | 2015050156 A | 3/2015 |
| KR | 20060117537 A | 11/2006 |
| KR | 100980972 B1 | 9/2010 |
| TW | 439093 B | 6/2001 |
| TW | 201243942 A | 11/2012 |
| TW | 201324674 A | 6/2013 |
| TW | 201526101 A | 7/2015 |
| TW | M587362 U | 12/2019 |
| WO | 2008005756 A2 | 1/2008 |
| WO | 2013035983 A1 | 3/2013 |

OTHER PUBLICATIONS

International Search Report and Written Opinion dated Apr. 24, 2017 for Application No. PCT/US2016/069449 (APPM/023690PC).
"Bracelet Holder Vise Clamp Stone Prong Pave Channel Setting Setter." PROLINEMAX, www.prolinemax.com/BRACELET-HOLDER-VISE-Clamp-Stone-Prong-Pave-Channel-Setting-Setter-_p_1006.html.
Chinese Office Action for Application No. 201821554985.2 dated Feb. 19, 2019 (APPM/25317CNU).
Taiwan Office Action dated Mar. 22, 2019 for Application No. 107217385 (APPM/25669TWU).
Notice of Allowance and Fees Due dated Oct. 6, 2017 for U.S. Appl. No. 15/382,004 (APPM/22403US).
Notice of Allowance and Fees Due dated Oct. 25, 2017 for U.S. Appl. No. 15/382,004 (APPM/22403US).
Notice of Allowance and Fees Due dated Feb. 21, 2018 for U.S. Appl. No. 15/382,004 (APPM/22403US).
Notice of Allowance and Fees Due dated Jun. 27, 2018 for U.S. Appl. No. 15/951,540 (APPM/22403USC01).
Non-Final Office Action dated Feb. 4, 2019 for U.S. Appl. No. 16/026,853 (APPM/24403USC02).
Notice of Allowance and Fees Due dated Aug. 19, 2019 for U.S. Appl. No. 16/026,853 (APPM/22403USC02).
Notice of Allowance and Fees Due/ Examiner Initiated Interview Summary dated Sep. 23, 2019 for U.S. Appl. No. 16/026,853 (APPM/24403USC02).
Taiwan Office Action dated Sep. 20, 2019 for Application No. 106100104 (APPM/23690TW).
PCT Notification of Transmittal of the International Search Report and the Written Opinion of the International Searching Authority for International Application No. PCT/US2019/051771; dated Mar. 24, 2020; 11 total pages.
Japanese Office Action for Application No. JP 2019-111014 dated Aug. 25, 2020.
International Search Report and Written Opinion for PCT/US2020/016242 (APPM/44016122PC) dated Jul. 14, 2020.
Japanese Office Action dated Oct. 27, 2020 for Application No. 2018-522911 (APPM/23690JP).
Korean Office Action in related application 10-2019-0069336 dated Nov. 11, 2020.
Office Action in related application TW108120460 (APPM/44014827TW) dated Jan. 26, 2021.
Office Action from Japanese Patent Application No. 2021-084341 dated May 24, 2022.
Korean Office Action dated Sep. 6, 2023, for Korean Patent Application No. 10-2018-7021530.

* cited by examiner

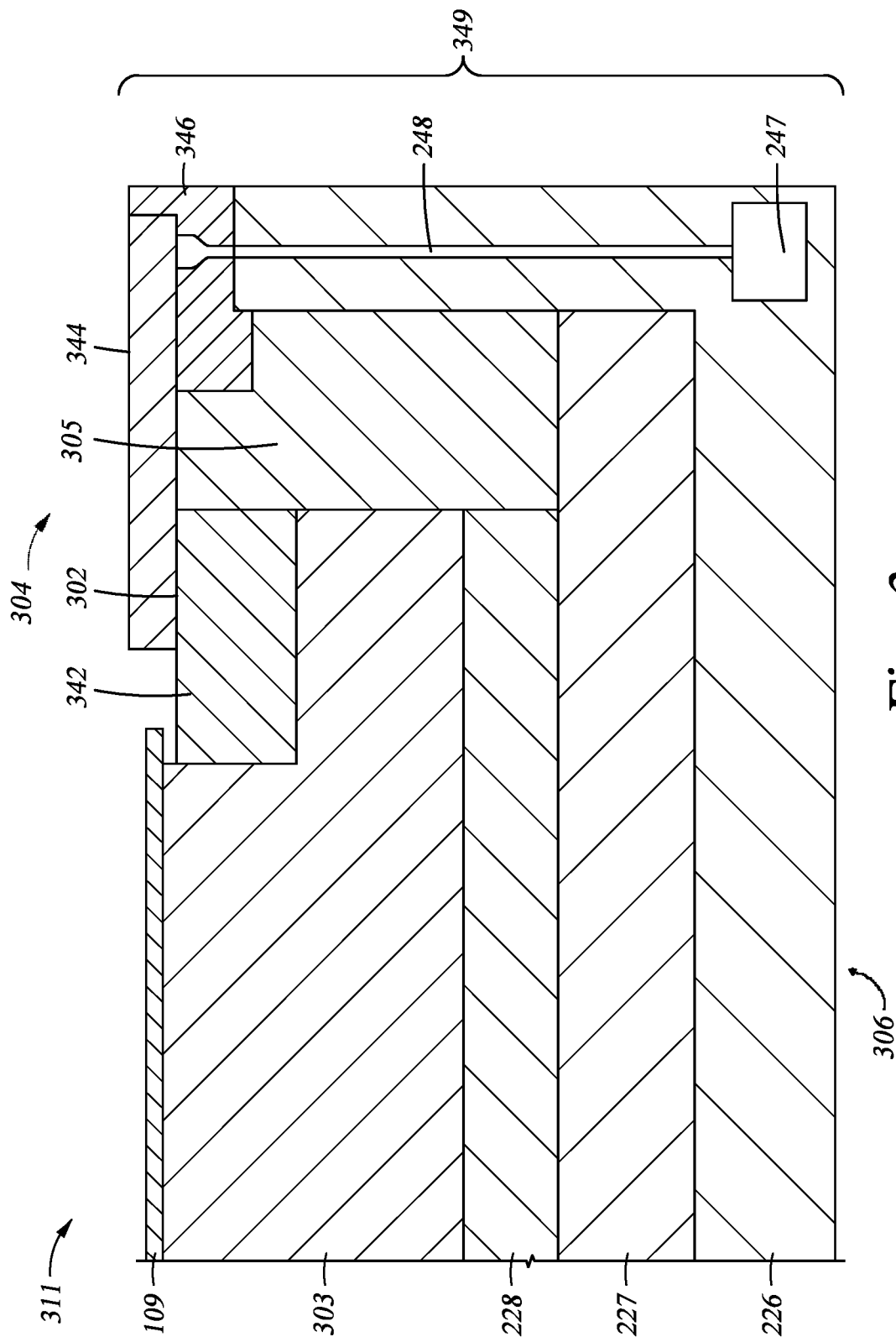

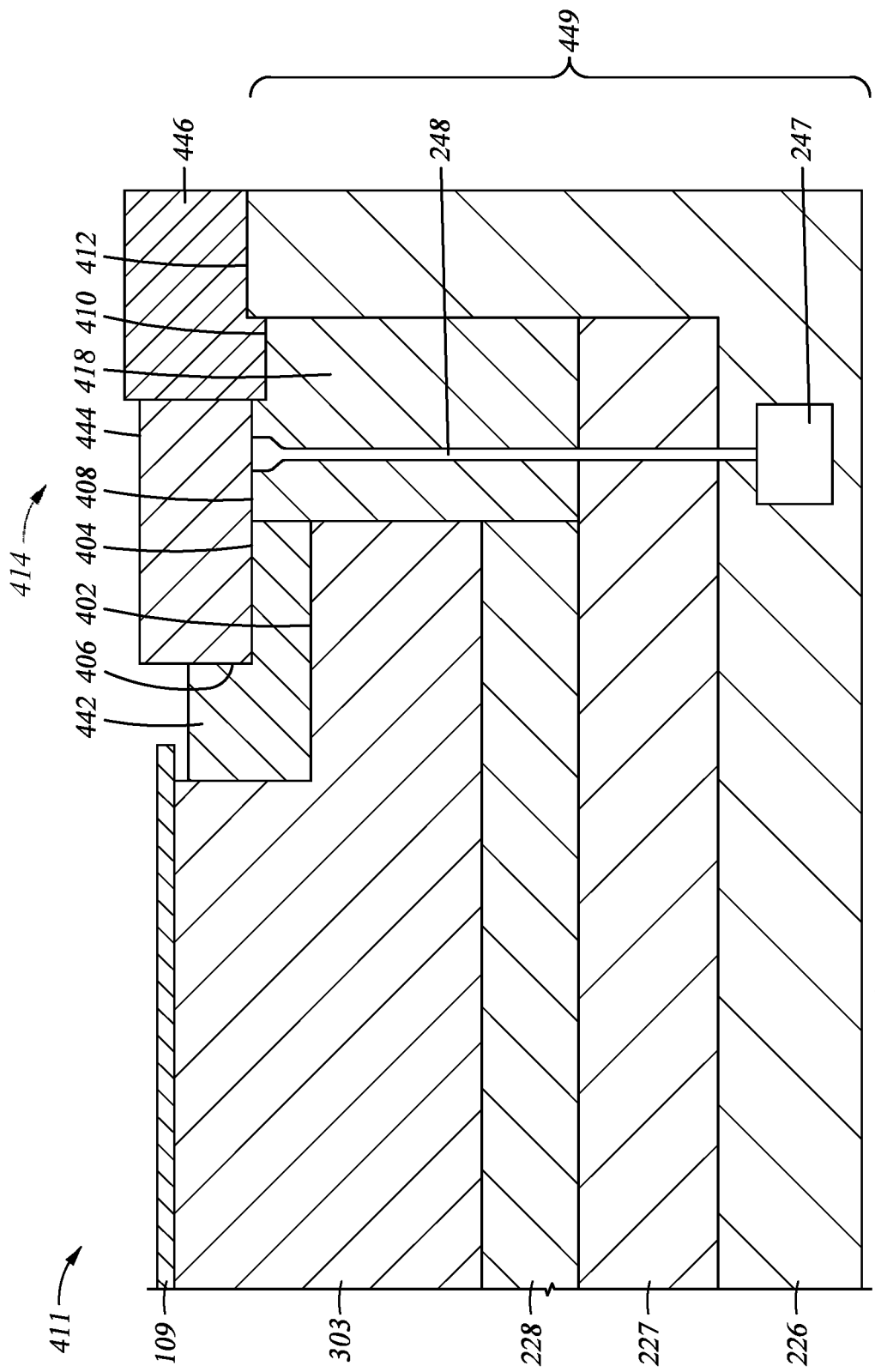

WAFER EDGE RING LIFTING SOLUTION

CROSS-REFERENCE TO RELATED APPLICATIONS

This application is a continuation of and claims benefit of U.S. patent application Ser. No. 15/399,809, filed on Jan. 6, 2017, U.S. Provisional Patent Application Ser. No. 62/287,038, filed on Jan. 26, 2016, and Indian Provisional Application No. 201641019009, filed on Jun. 2, 2016, each of which is herein incorporated by reference in its entirety.

BACKGROUND

Field

Examples of the present disclosure generally relate to apparatuses for processing substrates, such as semiconductor substrates. More particularly, a process kit and methods for use thereof, are disclosed.

Description of the Related Art

In the processing of substrates, such as semiconductor substrates and display panels, a substrate is placed on a support in a process chamber while suitable process conditions are maintained in the process chamber to deposit, etch, form layers on, or otherwise treat surfaces of the substrate. During etching processes, a plasma, which drives the etching process, may not be uniformly distributed across the substrate surface. The non-uniformity is particularly apparent at the edge of the substrate surface. This non-uniformity contributes to poor processing results. Thus, some process chambers use edge rings, which may also be referred to as a process kit ring, in order to increase plasma uniformity and improve process yield.

However, traditional edge rings erode over time. As the edge ring erodes, plasma uniformity across the substrate surface decreases, thereby negatively affecting substrate processing. Since there is a direct correlation between plasma uniformity and the quality of processed substrates, traditional process chambers require frequent replacement of edge rings to maintain plasma uniformity. However, the frequent replacement of edge rings results in undesirable downtime for preventative maintenance, and leads to increased costs for consumable components such as the edge rings.

Therefore, there is a need in the art for methods and apparatuses that improve plasma uniformity.

SUMMARY

Apparatuses including a height-adjustable edge ring and methods for use thereof are described herein. In one example, a process kit for processing a substrate is provided. The process kit has a support ring comprising an upper surface having a radially inner edge disposed at a first height and a radially outward edge disposed at a second height less than the first height, the radially inner edge having a greater thickness than the radially outward edge. An edge ring is disposed on the support ring, an inner surface of the edge ring interfaced with the radially inner edge of the support ring. A cover ring is disposed radially outward of the edge ring, the edge ring independently moveable relative to the support ring and the cover ring. One or more push pins are disposed radially inward of an inner diameter of the cover ring, the one or more push pins being operable to elevate the edge ring, wherein movement in a radial direction of the support ring is constrained by the one or more push pins.

BRIEF DESCRIPTION OF THE DRAWINGS

So that the manner in which the above recited features of the present disclosure can be understood in detail, a more particular description of the disclosure, briefly summarized above, may be had by reference to aspects of the disclosure, some of which are illustrated in the appended drawings. It is to be noted, however, that the appended drawings illustrate only typical aspects of this disclosure and are therefore not to be considered limiting of its scope, for the disclosure may admit to other equally effective aspects.

FIG. 3 is an enlarged schematic cross-sectional partial side view of a substrate support assembly according to another example of the disclosure.

FIG. 4 is an enlarged schematic cross-sectional partial side view of a substrate support assembly according to another example of the disclosure.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Apparatuses including a height-adjustable edge ring, and methods for use thereof are described herein. In one example, a substrate support assembly includes a height-adjustable edge ring, and the substrate support assembly is located within a process chamber. The substrate support assembly includes an electrostatic chuck, an edge ring positioned on a portion of the electrostatic chuck, and one or more actuators to adjust the height of the edge ring via one or more push pins. The height-adjustable edge ring can be used to compensate for erosion of the edge ring over time. In addition, the height-adjustable edge ring can be removed from the process chamber via a slit valve opening without venting and opening the process chamber. The height-adjustable edge ring can be tilted by the one or more actuators in order to improve azimuthal uniformity at the edge of the substrate.

Figure 1:
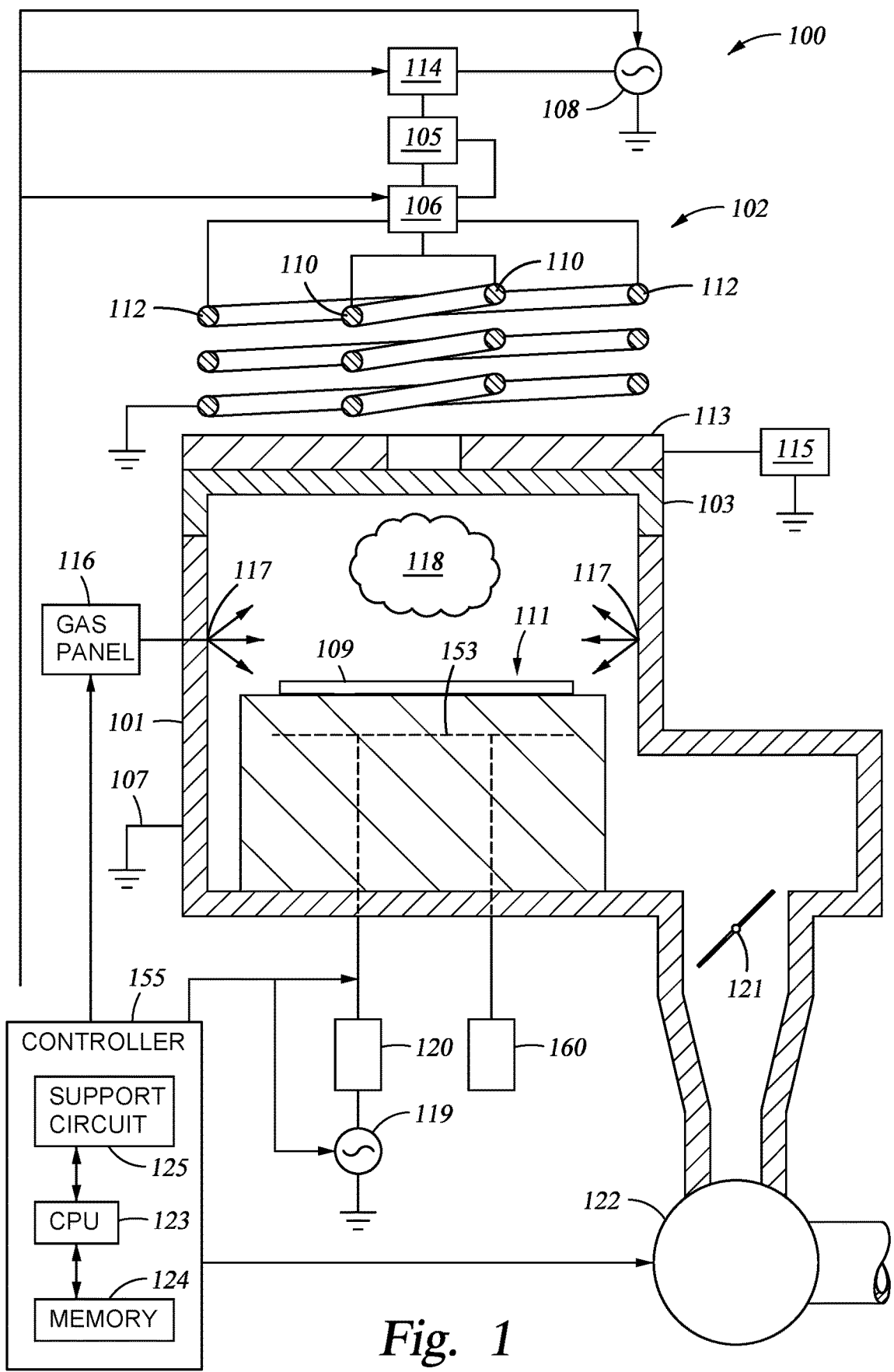
FIG. 1 is a schematic cross-sectional side view of a process chamber according to one example of the disclosure.

FIG. 1 is a schematic sectional view of a process chamber 100, according to one example of the disclosure. The process chamber 100 includes a chamber body 101 and a lid 103 disposed thereon that together define an inner volume. The chamber body 101 is typically coupled to an electrical ground 107. A substrate support assembly 111 is disposed within the inner volume to support a substrate 109 thereon during processing. The process chamber 100 also includes an inductively coupled plasma apparatus 102 for generating a plasma within the process chamber 100, and a controller 155 adapted to control examples of the process chamber 100.

The substrate support assembly 111 includes one or more electrodes 153 coupled to a bias source 119 through a matching network 120 to facilitate biasing of the substrate 109 during processing. The bias source 119 may illustratively be a source of up to about 1000 W (but not limited to about 1000 W) of RF energy at a frequency of, for example, approximately 13.56 MHz, although other frequencies and powers may be provided as desired for particular applications. The bias source 119 may be capable of producing either or both of continuous or pulsed power. In some examples, the bias source 119 may be a DC or pulsed DC source. In some examples, the bias source 119 may be capable of providing multiple frequencies. The one or more electrodes 153 may be coupled to a chucking power source 160 to facilitate chucking of the substrate 109 during processing. The substrate support assembly 111 may include a process kit (not shown) surrounding the substrate 109. Various embodiments of the process kit are described below.

The inductively coupled plasma apparatus 102 is disposed above the lid 103 and is configured to inductively couple RF power into the process chamber 100 to generate a plasma within the process chamber 100. The inductively coupled plasma apparatus 102 includes first and second coils 110, 112, disposed above the lid 103. The relative position, ratio of diameters of each coil 110, 112, and/or the number of turns in each coil 110, 112 can each be adjusted as desired to control the profile or density of the plasma being formed. Each of the first and second coils 110, 112 is coupled to an RF power supply 108 through a matching network 114 via an RF feed structure 106. The RF power supply 108 may illustratively be capable of producing up to about 4000 W (but not limited to about 4000 W) at a tunable frequency in a range from 50 kHz to 13.56 MHz, although other frequencies and powers may be utilized as desired for particular applications.

In some examples, a power divider 105, such as a dividing capacitor, may be provided between the RF feed structure 106 and the RF power supply 108 to control the relative quantity of RF power provided to the respective first and second coils. In some examples, the power divider 105 may be incorporated into the matching network 114.

A heater element 113 may be disposed atop the lid 103 to facilitate heating the interior of the process chamber 100. The heater element 113 may be disposed between the lid 103 and the first and second coils 110, 112. In some examples, the heater element 113 may include a resistive heating element and may be coupled to a power supply 115, such as an AC power supply, configured to provide sufficient energy to control the temperature of the heater element 113 within a desired range.

During operation, the substrate 109, such as a semiconductor wafer or other substrate suitable for plasma processing, is placed on the substrate support assembly 111 and process gases supplied from a gas panel 116 through entry ports 117 into the inner volume of the chamber body 101. The process gases are ignited into a plasma 118 in the process chamber 100 by applying power from the RF power supply 108 to the first and second coils 110, 112. In some examples, power from a bias source 119, such as an RF or DC source, may also be provided through a matching network 120 to electrodes 153 within the substrate support assembly 111. The pressure within the interior of the process chamber 100 may be controlled using a valve 121 and a vacuum pump 122. The temperature of the chamber body 101 may be controlled using liquid-containing conduits (not shown) that run through the chamber body 101.

The process chamber 100 includes a controller 155 to control the operation of the process chamber 100 during processing. The controller 155 comprises a central processing unit (CPU) 123, a memory 124, and support circuits 125 for the CPU 123 and facilitates control of the components of the process chamber 100. The controller 155 may be one of any form of general-purpose computer processor that can be used in an industrial setting for controlling various chambers and sub-processors. The memory 124 stores software (source or object code) that may be executed or invoked to control the operation of the process chamber 100 in the manner described herein.

Figure 2A:
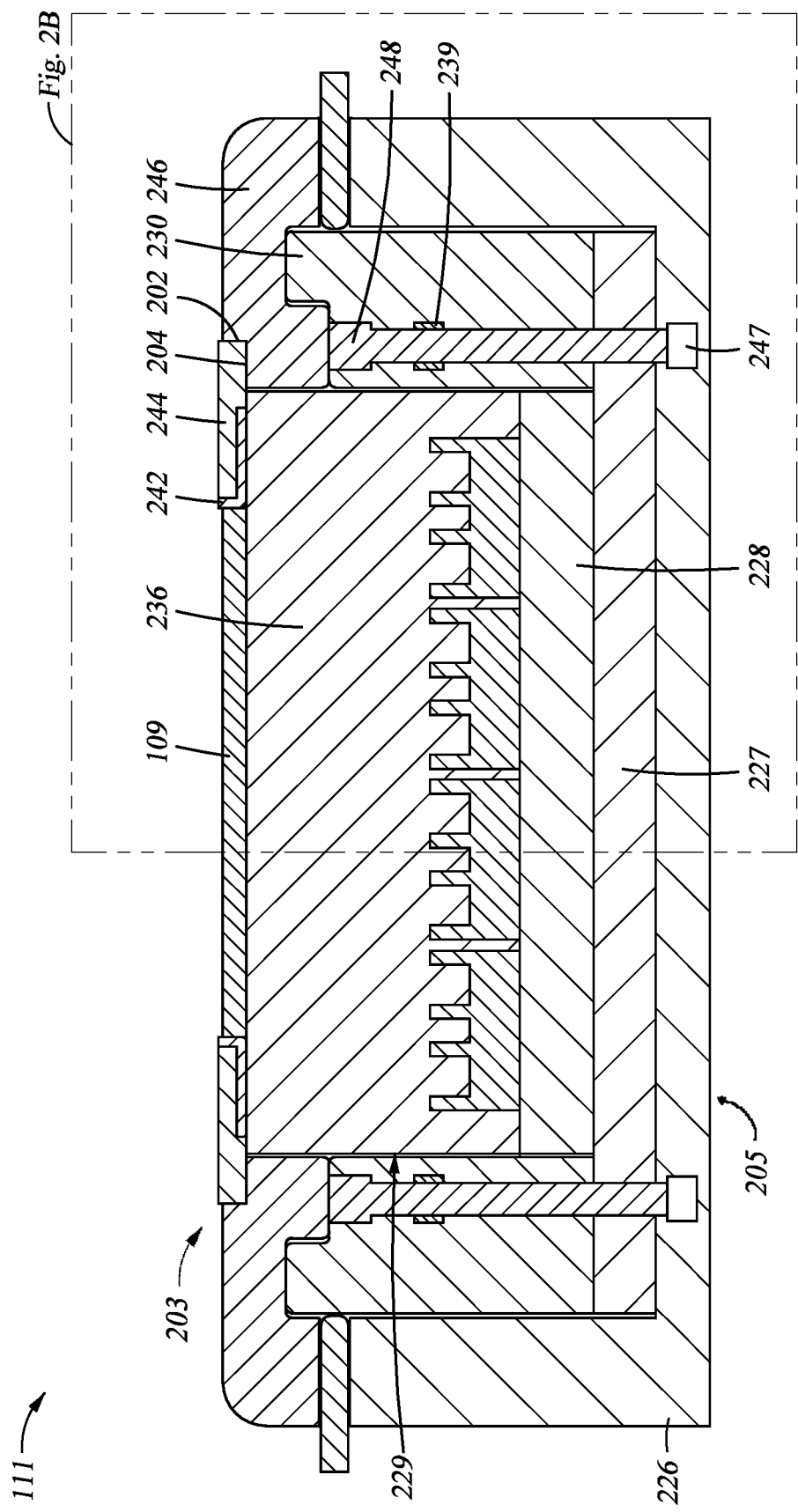
FIGS. 2A-2B are enlarged schematic cross-sectional side views of a substrate support assembly of the process chamber of FIG. 1 according to one example of the disclosure.
Figure 2B:
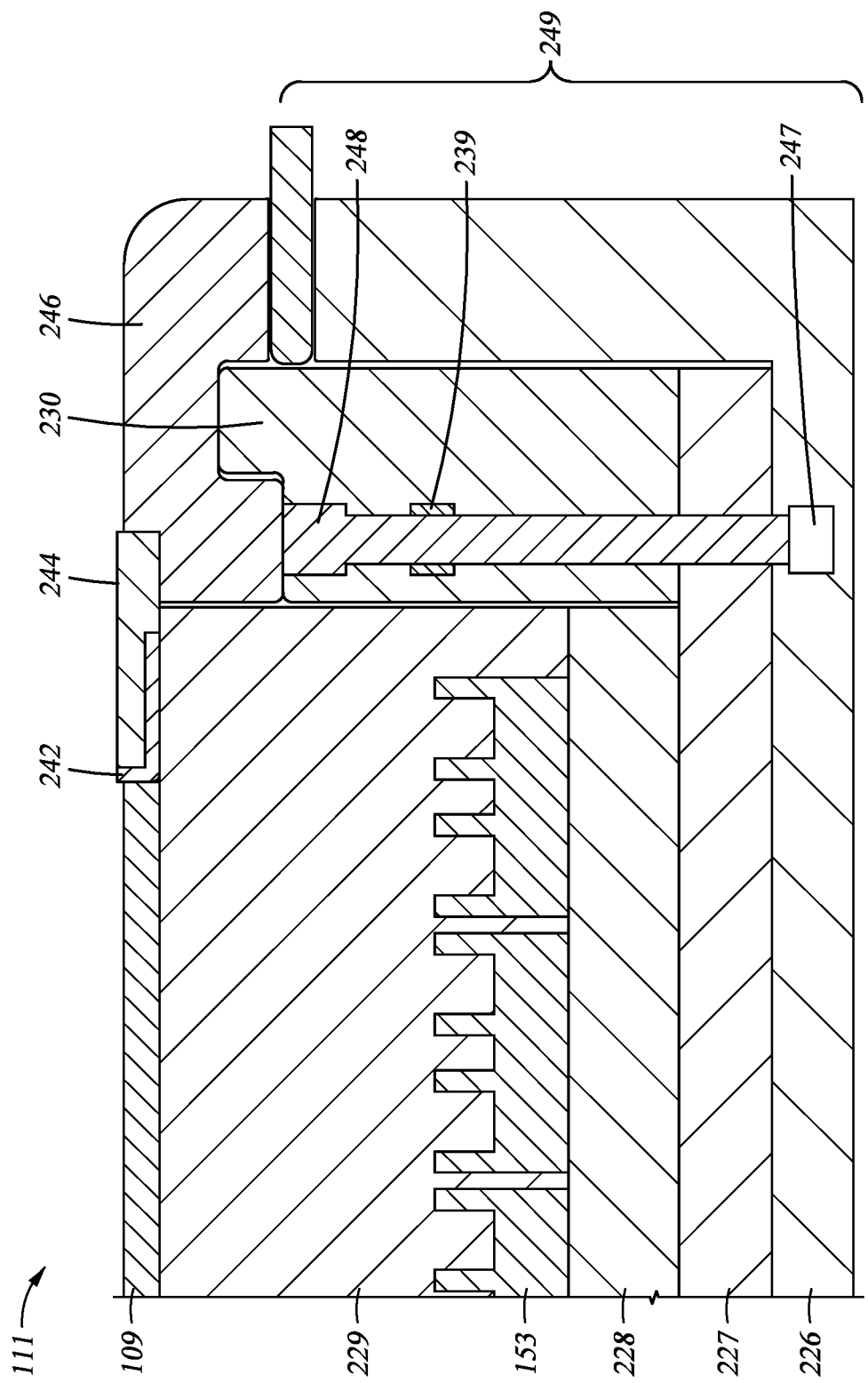

FIGS. 2A and 2B are enlarged schematic views of the substrate support assembly 111 of process chamber 100 according to one example described herein. The substrate support assembly 111 includes a process kit 203, a substrate support 205, and an electrostatic chuck 229. The electrostatic chuck 229 is disposed on a top surface of the substrate support 205 and surrounded by the process kit 203. The substrate support 205 includes a ground plate 226 surrounding an insulating plate 227, and a facilities plate 228 assembled in a vertical stack. The substrate support 205 further includes a sleeve 230 circumscribing the facilities plate 228 and the electrostatic chuck 229 to insulate the RF hot electrostatic chuck 229 from the ground plate 226. The sleeve 230 may be fabricated from quartz. The process kit 203 includes a cover ring 246, a first edge ring 242, and a second edge ring 244. The cover ring 246 is positioned on an upper surface of the vertical edge of the ground plate 226 and includes a recess for engaging the sleeve 230. The cover ring 246 may be fabricated from quartz or any other plasma-resistant material.

The facilities plate 228 is positioned above a lower portion of the ground plate 226 and between the insulating plate 227 and the electrostatic chuck 229. The electrostatic chuck 229 may include a plurality of electrodes 153 (four are shown) embedded in an insulating material 236. The electrodes 153 are coupled to the chucking power source 160 (shown in FIG. 1) to facilitate chucking of a substrate 109 to an upper surface of the electrostatic chuck 229. One or more heating or cooling channels may optionally be formed in the insulating material 236 to facilitate temperature control of the substrate 109 during processing. In some aspects, the electrodes 153 are cathodes coupled through the matching network 120 to the bias source 119 (shown in FIG. 1).

The first edge ring 242 is positioned on the electrostatic chuck 229. The first edge ring 242 surrounds and abuts the radially-outward edges of the substrate 109. The first edge ring 242 facilitates protection of the edges of the substrate 109 during processing, and additionally, provides lateral support to the substrate 109 during processing. The first edge ring 242 may be stationary with respect to the substrate 109 during processing.

The second edge ring 244 is positioned over and radially outward of the first edge ring 242. The radially-outward edge 202 of the second edge ring 244, as well as a bottom surface 204 of the second edge ring 244, is in contact with a cover ring 246. The second edge ring 244 is positioned concentrically with respect to the first edge ring 242 and the substrate 109. The second edge ring 244 assists the first edge ring 242 in providing the substrate 109 with lateral support and reducing undesired etching or deposition of material at the radially-outward edges of the substrate 109.

The substrate support assembly 111 may also include one or more actuators 247 (one is shown), such as a stepper motor or linear actuator, among others. In one example, the one or more actuators 247 are disposed in the ground plate 226. It is contemplated, however, that the actuator 247 may be positioned externally of the substrate support assembly 111. Each actuator 247 is adapted to engage, or interface with, one or more push pins 248. The one or more push pins 248 extend from the ground plate 226, through the facilities plate 228 and the sleeve 230, and into contact with the cover ring 246. Actuation of the one or more push pins 248 results in vertical actuation, or displacing, of the cover ring 246 and the second edge ring 244 relative to an upper surface of the substrate 109 and/or the first edge ring 242. It is contemplated that the first edge ring 242 may be omitted in some aspects. The position of the second edge ring 244 may be adjusted to a height which accommodates for erosion of the second edge ring 244 in order to increase plasma uniformity across a substrate surface during processing.

One or more bellows (shown in FIG. 7) may be positioned around each of the one or more push pins 248 to reduce particle contamination within the process chamber 100 (shown in FIG. 1). Additionally, one or more push pin guides 239, such as a guide sleeve or bearing, may be positioned in the sleeve 230 around each push pin 248 to facilitate actuation of each push pin 248. The push pin guides 239 provide bearing surfaces for push pins 248. In one example, the one or more actuators 247, the one or more push pins 248, the cover ring 246 and the second edge ring 244 may be referred to as a height-adjustable edge ring assembly 249. In one example, the edge ring assembly 249 may further interface and be operably controlled by the controller 155 (shown in FIG. 1). In another example, the edge ring assembly 249 may omit the cover ring 246. In such an example, the one or more push pins 248 may directly contact and actuate the second edge ring 244.

In one example, the first edge ring 242 may be fabricated from silicon. In one example, the second edge ring 244 may be fabricated from silicon. In a particular example, the second edge ring 244 may be fabricated from silicon carbide (SiC). In one example, the one or more actuators 247 are micro-stepper motors. In another example, the one or more actuators 247 are piezo-electric motors. In one example, the one or more push pins 248 are fabricated from quartz or sapphire. In one example, the controller may be a general purpose computer that includes memory for storing software. The software may include instructions for detecting erosion of the second edge ring 244 and then directing the one or more actuators 247 to raise the one or more push pins 248 such that the second edge ring 244 is elevated to a desired height.

FIG. 3 is an enlarged schematic partial view of a substrate support assembly 311 according to another example. Similar to the substrate support assembly 111, the substrate support assembly 311 includes a process kit 304, a substrate support 306, and an electrostatic chuck 303. The electrostatic chuck 303 is disposed on a top surface of the substrate support 306, and surrounded by the process kit 304. The substrate support 306 includes the ground plate 226, the insulating plate 227, the facilities plate 228, and a sleeve 305.

The process kit 304 includes a first edge ring 342, a second edge ring 344, and a cover ring 346. The first edge ring 342 is positioned adjacent to the radially outward edges of the substrate 109 to reduce undesired processing effects at the edge of the substrate 109. The second edge ring 344 is positioned radially outward of and above the first edge ring 342. The second edge ring 344 may be positioned radially inward of and above the cover ring 346. In a lowermost position, the second edge ring 344 may have a lower surface 302 in contact with one or more of the first edge ring 342, the sleeve 230, and the cover ring 346. In the lowermost position, the second edge ring 344 may share a coplanar upper surface with the cover ring 346. The substrate support assembly 311 may be similar to the substrate support assembly 111; however, the one or more push pins 248 are positioned to contact the second edge ring 344. The second edge ring 344 may be fabricated from the same material as the second edge ring 244. The one or push pins 248 actuate the second edge ring 344 directly, rather than indirectly via actuation of the cover ring 346. In such an example, the cover ring 346 remains stationary during height adjustment of the second edge ring 344. The substrate support assembly 311 may be used in place of the substrate support assembly 111.

The substrate support assembly 311 includes a height-adjustable edge ring assembly 349 including one or more actuators 247, one or more push pins 248, and the second edge ring 344. The edge ring assembly 349 may be similar to the edge ring assembly 249; however, the one or more push pins 248 of the edge ring assembly 349 are positioned through the vertical walls of the ground plate 226 and through the cover ring 346. Thus, the push pins 248 of the edge ring assembly 349 do not travel through the insulating plate 227 and the sleeve 230, eliminating the bores formed through the insulating plate 227 and the sleeve 230. Moreover, because the edge ring assembly 349 actuates the second edge ring 344 and allows the cover ring 346 to remain stationary, the substrate support assembly 311 may reduce particle generation due to a reduced number of moving parts. The first edge ring 342 may be fabricated from the same material as the first edge ring 242.

FIG. 4 is an enlarged schematic partial view of a substrate support assembly 411 according to another example. The substrate support assembly 411 may be similar to the substrate support assembly 311 and may be used in place thereof. The substrate support assembly 411 includes a process kit 414, a substrate support 416, and the electrostatic chuck 303. The electrostatic chuck 303 is disposed on a top surface of the substrate support 416 and surrounded by the process kit 414. The substrate support 416 includes the ground plate 226, the insulating plate 227, the facilities plate 228, and a sleeve 418. The process kit 414 includes a first edge ring 442, a second edge ring 444, and a cover ring 446. The first edge ring 442 is positioned on a radially outward upper surface 402 of the electrostatic chuck 303. The second edge ring 444 is positioned radially outward and upward of the first edge ring 442. A lower surface 404 of the second edge ring 444 may be positioned in contact with a surface 406 of the first edge ring 442 and an upper surface 408 of a first portion of the sleeve 418. The cover ring 446 is positioned radially outward of the second edge ring 444 and in contact with an upper surface 410 of a second portion of the sleeve 418 as well as an upper surface 412 of a vertical portion of the ground plate 226.

The substrate support assembly 411 includes a height-adjustable edge ring assembly 449. The edge ring assembly 449 includes one or more actuators 247, one or more push pins 248, and the second edge ring 444. The one or more actuators 247 actuate the one or more push pins 248 to elevate the second edge ring 444 relative to an upper surface of the substrate 109, as well relative to the first edge ring 442 and the cover ring 446. Similar to the substrate support assembly 311, the cover ring 446 remains stationary while the second edge ring 444 is elevated. Due to a reduced number of movable components, there is a reduced likelihood of particle generation during processing. However, unlike the substrate support assembly 311, the push pins 248 of the substrate support assembly 411 are disposed through the insulating plate 227 and the sleeve 418. The one or more push pins 248 contact a lower surface 404 of the second edge ring 444 to transfer movement from the actuator 247 to the second edge ring 444. In one example, the first edge ring 442 may be fabricated from silicon. In one example, the second edge ring 444 may be fabricated from silicon. In a particular example, the second edge ring 444 may be fabricated from silicon carbide (SiC).

Figure 5:
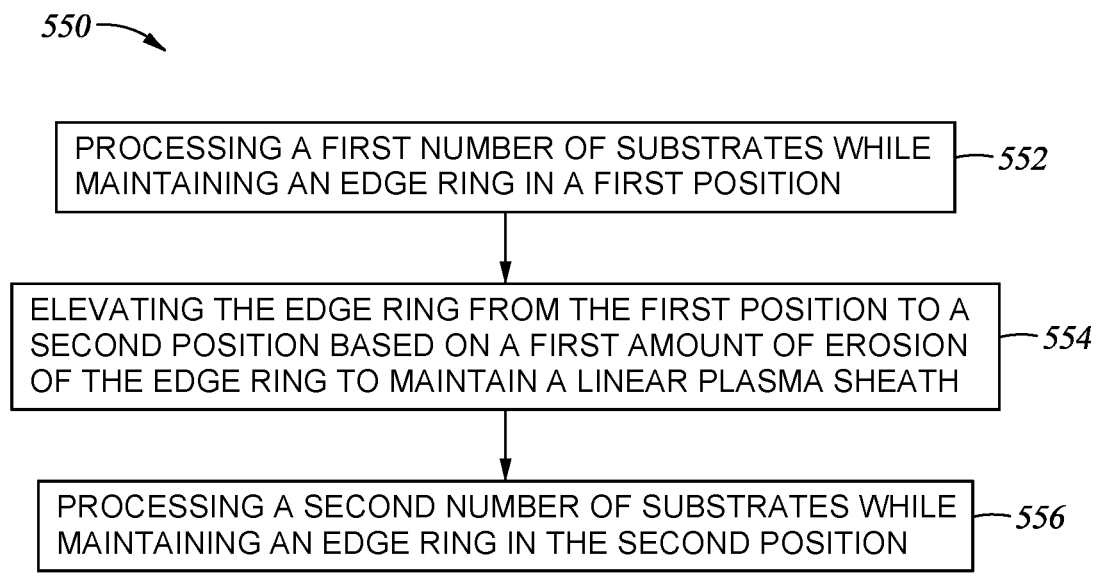
FIG. 5 is a flow chart of a method according to examples described herein.
Figure 6A:
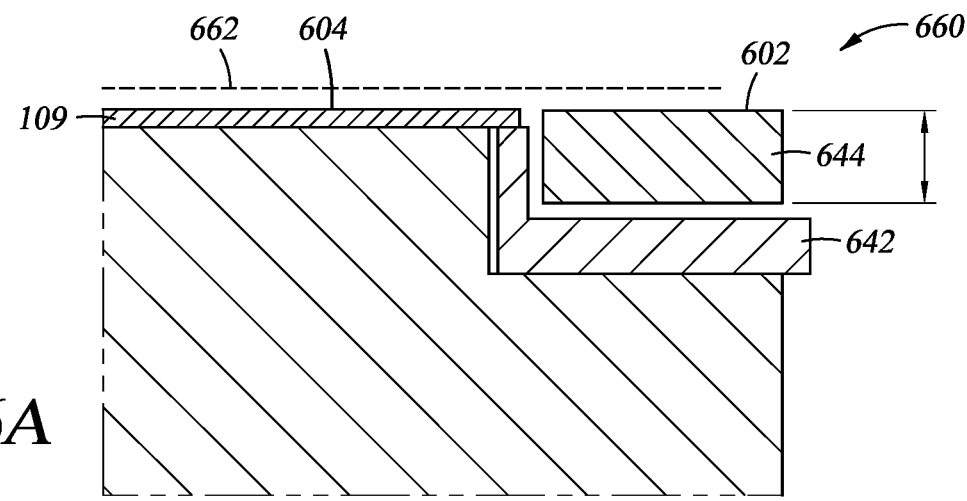
FIGS. 6A-6C schematically illustrate substrate surfaces at various stages of the method of FIG. 5 according to examples of the disclosure.
Figure 6B:
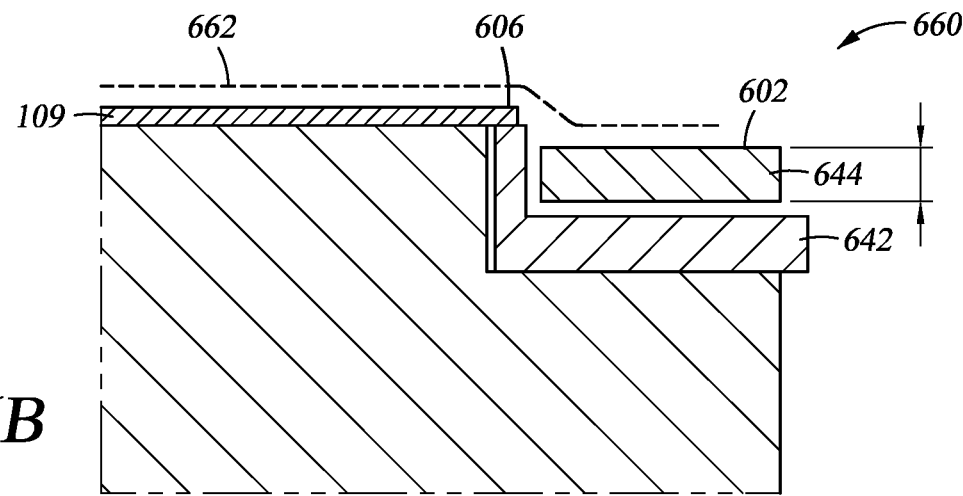
Figure 6C:
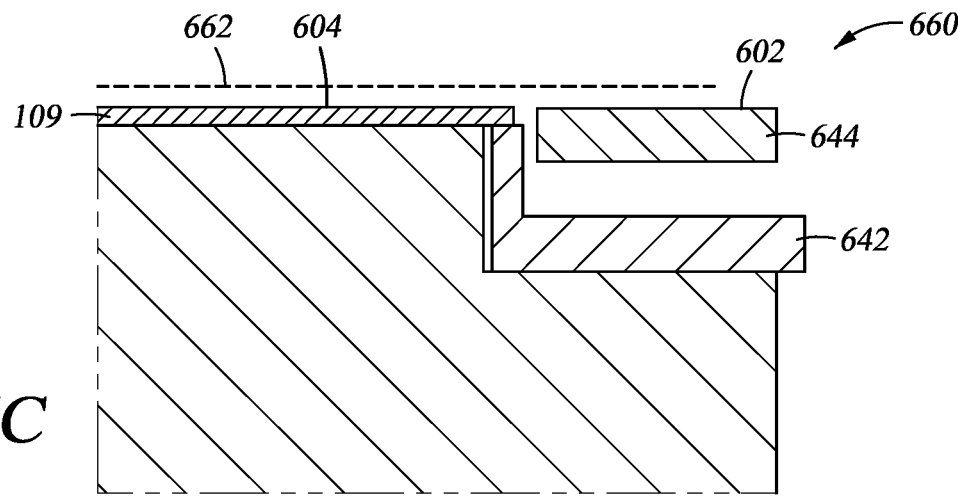

FIG. 5 is a flow chart of a method 550 according to examples described herein. FIGS. 6A-6C depict plasma uniformity across substrate surfaces at a portion of a substrate support assembly 660 at various stages of the method 550 described herein. FIG. 5 and FIGS. 6A-6C will be discussed in conjunction to further describe the processes for adjusting the height of an height-adjustable edge ring, such as the second edge rings 244, 344, 444 to compensate for erosion of that ring. The method may be stored on and executed by a controller, such as the controller 155.

The method 550 begins at operation 552. In operation 552, a first number of substrates of substrate are processed. While processing the first number of substrates, a top surface 602 of an edge ring 644 is coplanar with a top surface 604 of the substrate 109, as shown in FIG. 6A. The edge ring 644 may be the second edge ring 244, 344, 444. When the top surface 602 of the edge ring 644 and the top surface 604 of the substrate 109 are coplanar, plasma is uniformly distributed over the substrate 109 such that the plasma sheath 662 runs parallel to the top surface 604 of the substrate 109.

After processing the first number of substrates, the edge ring 644 may be eroded as shown in FIG. 6B. As the edge ring 644 is eroded, the total thickness of the edge ring 644 is decreased and the top surface 602 of the edge ring 644 is no longer coplanar with the top surface 604 of the substrate 109. Instead, the top surface 602 of the edge ring 644 is below the top surface 604 of the substrate 109. When the top surface 602 of the edge ring 644 is not coplanar with the top surface 604 of the substrate 109, plasma becomes non-uniformly distributed across the top surface 604 of substrate 109. More specifically, when the top surface 602 of the edge ring 644 is below the top surface 604 of the substrate 109, there is plasma "roll off" at an edge 606 of the substrate 109 as shown by the plasma sheath 662. In other words, the plasma sheath 662 is no longer parallel to the top surface 604 of the substrate 109. This plasma non-uniformity at the substrate edge 606 causes non-uniform process conditions, which decreases process yield of the substrate 109 upon which devices may be formed.

Accordingly, in operation 554, the edge ring 644 is elevated from a first position above an edge ring 642 to a second position above the edge ring 642 based on a first amount of erosion of the edge ring 644. The edge ring 642 may be the first edge ring 242, 342, 442. The edge ring 644 may be the second edge ring 244, 344, 444. The edge ring 644 is elevated to maintain a linear plasma sheath 662 (i.e., maintain the plasma sheath 662 to be parallel to the top surface 604 of the substrate 109), as shown in FIG. 6C. In one example, the edge ring 644 may be elevated to a position such that the top surface 602 of the edge ring 644 in an eroded state is substantially coplanar with the top surface 604 of the substrate 109. The height to which the edge ring 644 may be adjusted may be determined using a controller, such as the controller 155 shown in FIG. 1. The controller may be used for detecting the first amount of erosion of the edge ring 644. The controller may then direct one or more actuators 247 to elevate the height of the edge ring 644 via one or more push pins to compensate for the first amount of erosion. The distance between the first position and the second position may be about 0.05 millimeters to about 5 millimeters.

Alternatively, instead of detecting the amount of erosion on the edge ring 644, the edge ring 644 may be adjusted after an empirically-determined number of substrates are processed. Alternatively, the edge ring 644 may be adjusted in response to a measurement of plasma sheath deformation.

In operation 556, a second number of substrates are processed while maintaining the edge ring 644 in the adjusted position. While in the adjusted position, the edge ring 644 positions the plasma sheath 662 in a coplanar orientation with the top surface 604 of the substrate 109. After processing a second number of substrates, the method 550 may further include detecting a second amount of erosion of the edge ring 644 and elevating the edge ring 644 from the second position to a third position. The distance between the second position and the third position may be about 0.05 millimeters to about 5 millimeters. The operations of method 550 may be repeated as more substrates are processed and further erosion of the edge ring 644 occurs.

Figure 7:
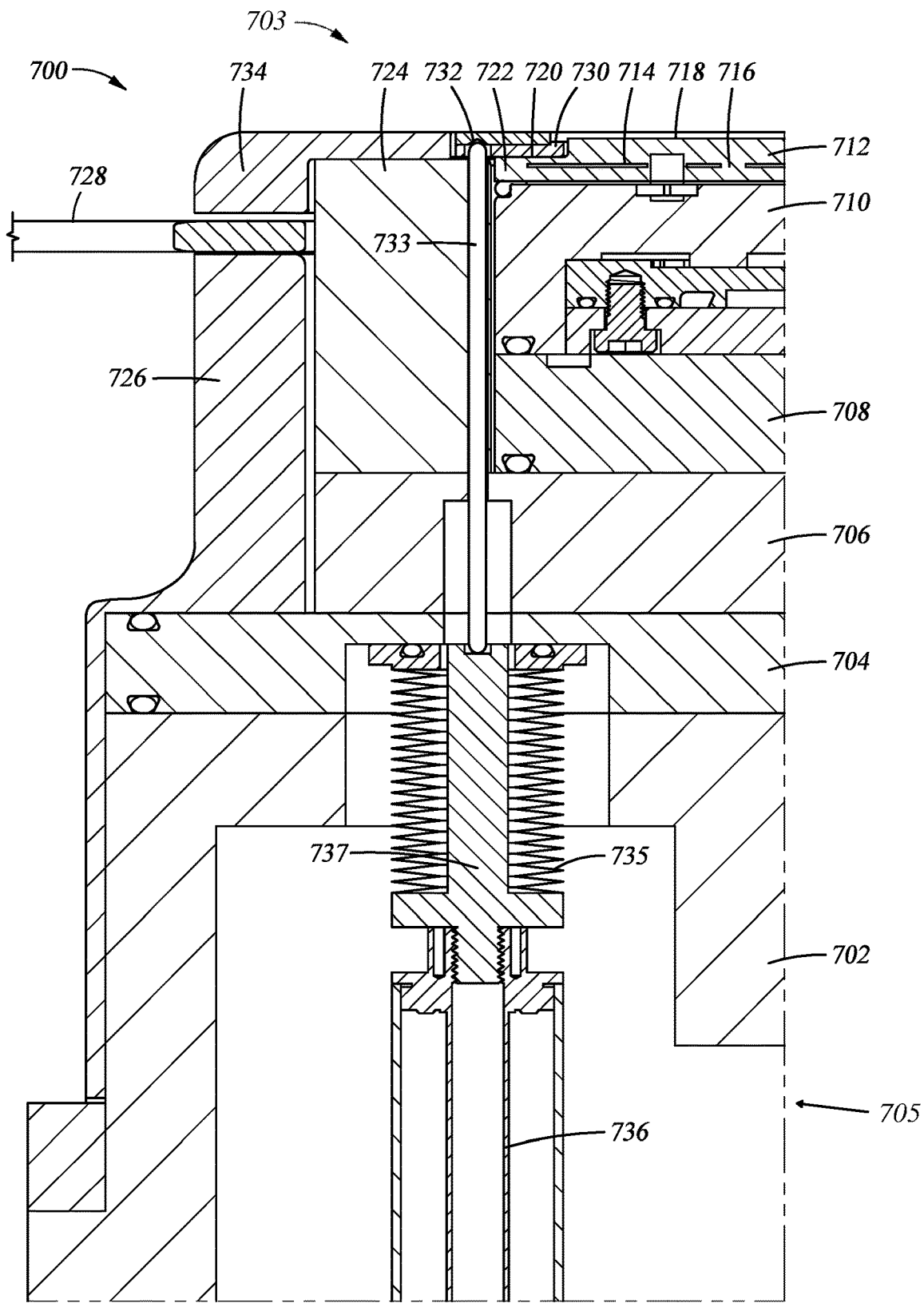
FIG. 7 is a schematic cross-sectional partial side view of a substrate support assembly according to another example of the disclosure.

FIG. 7 is a schematic cross-sectional side view of a substrate support assembly 700 according to another example of the disclosure. The substrate support assembly 700 may be the substrate support assembly 111 shown in FIG. 1. The substrate support assembly 700 includes a process kit 703, a substrate support 705, an electrostatic chuck 712, a cathode liner 726, and a shield 728. The electrostatic chuck 712 is disposed on a top surface of the substrate support 705 and surrounded by the process kit 703. The substrate support 705 may include a base 702, a ground plate 704 disposed on the base 702, an insulating plate 706 disposed on the ground plate 704, a facilities plate 708 disposed on the insulating plate 706, a cooling plate 710 disposed on the facilities plate 708, and a sleeve 724 disposed on the insulating plate 706 surrounding the facilities plate 708, the cooling plate 710, and the electrostatic chuck 712. The sleeve 724 may be fabricated from quartz. The electrostatic chuck 712 may be bonded to the cooling plate 710 with a bonding material. A plurality of electrodes 714 may be embedded in the electrostatic chuck 712. The electrostatic chuck 712 may include a first portion 716 having a first surface 718 for supporting a substrate and a second portion 720 extending radially-outward from the first portion 716. The second portion 720 may include a second surface 722.

The process kit 703 includes a support ring 730, an edge ring 732, and a cover ring 734. The support ring 730 is disposed on the second surface 722 of the second portion 720 of the electrostatic chuck 712, and the support ring 730 surrounds the first portion 716 of the electrostatic chuck 712. The support ring 730 may be fabricated from silicon or SiC. The support ring 730 may be positioned concentrically with respect to the first portion 716 of the electrostatic chuck 712. The support ring 730 may have an inner radius that is less than 100 microns greater than a radius of the first portion 716 of the electrostatic chuck 712. The edge ring 732 may be disposed on the support ring 730, and the edge ring 732 may be made of silicon, SiC, or other suitable material. The edge ring 732 may be positioned concentrically with respect to the first portion 716 of the electrostatic chuck 712. The cover ring 734 may be disposed on the sleeve 724 and the cover ring 734 may surround the edge ring 732 and the support ring 730.

The substrate support assembly 700 further includes one or more actuators 736 (one is shown), such as a stepper motor, one or more pin holders 737 (one is shown), one or more bellows 735 (one is shown), and one or more push pins 733 (one is shown). The push pins 733 may be fabricated from quartz, sapphire, or other suitable material. Each pin holder 737 is coupled to a corresponding actuator 736, each bellows 735 surrounds a corresponding pin holder 737, and each push pin 733 is supported by a corresponding pin holder 737. Each push pin 733 is positioned through an opening formed in each of the ground plate 704, the insulating plate 706, and the sleeve 724. One or more push pin guides, such as the push pin guides 239 shown in FIG. 2B, may be positioned around the openings in the ground plate 704, the insulating plate 706, and/or the sleeve 724. The one or more actuators 736 can raise the one or more pin holders 737 and the one or more push pins 733, which in turn raise or tilt the edge ring 732.

Figure 8A:
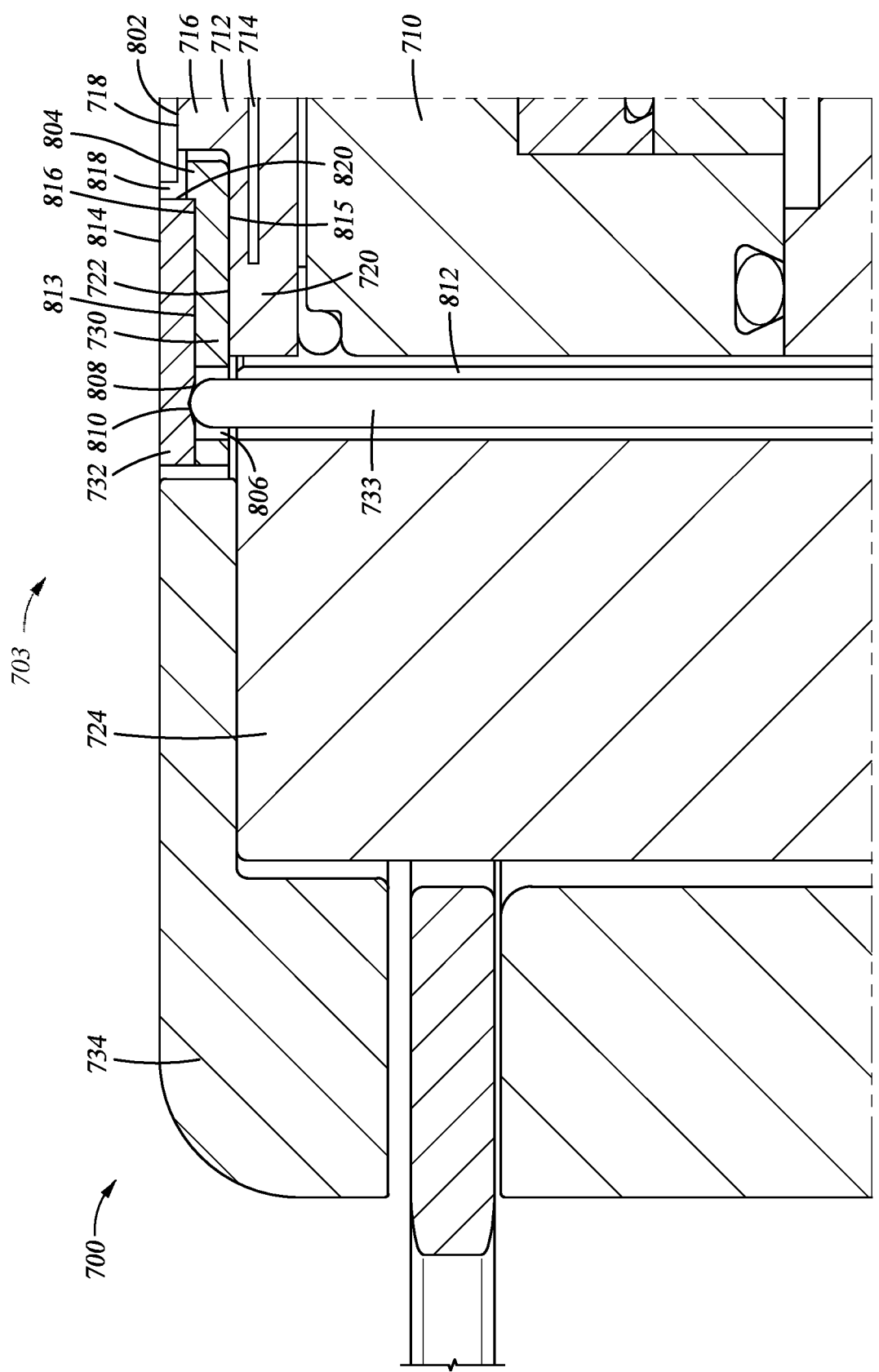
FIGS. 8A-8B are schematic cross-sectional partial side views of the substrate support assembly of FIG. 7 according to examples of the disclosure.
Figure 8B:
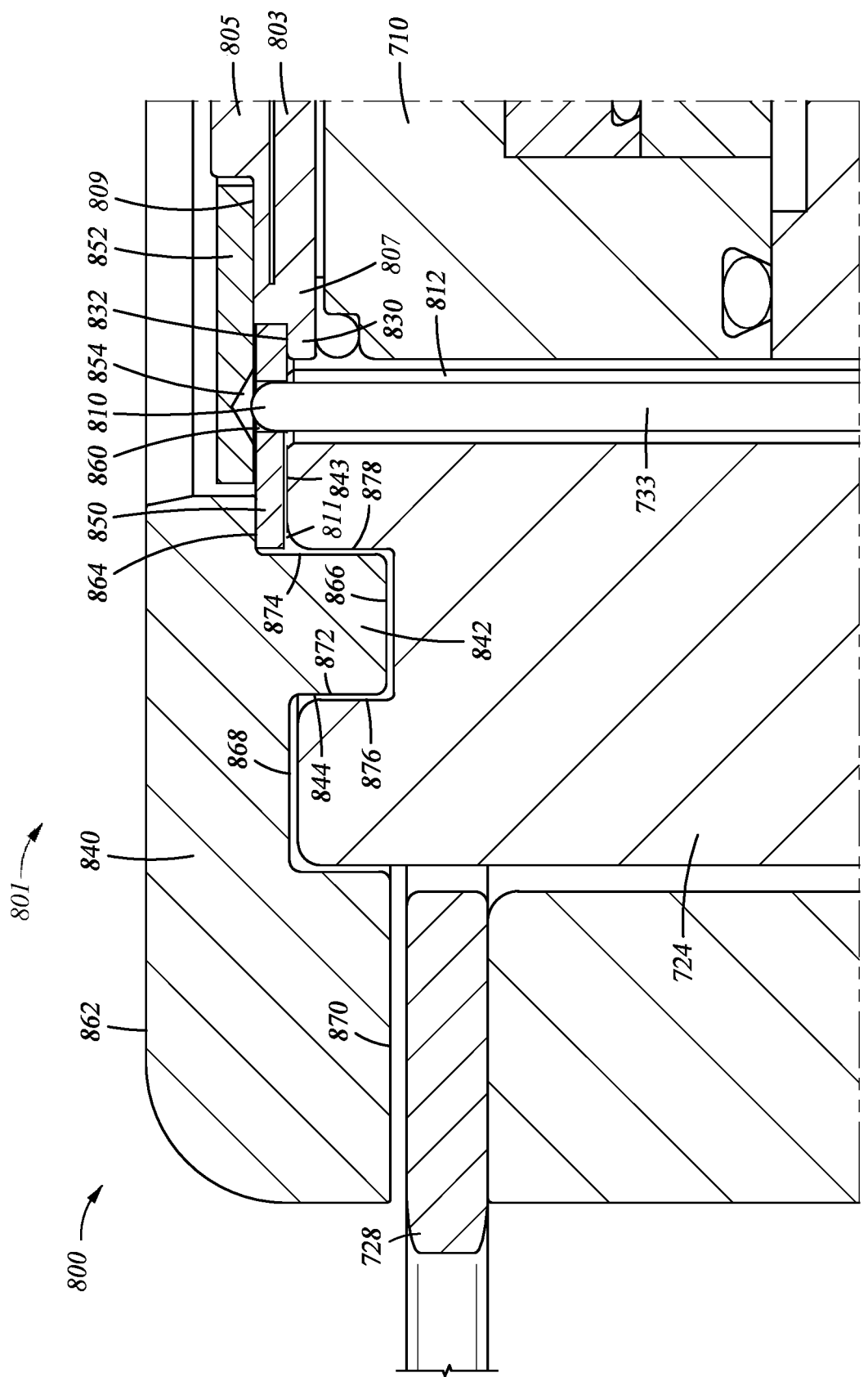

FIGS. 8A-8B are schematic cross-sectional partial side views of the substrate support assembly 700 according to examples of the disclosure. As shown in FIG. 8A, the push pin 733 is positioned through an opening 812 of the sleeve 724, and is in contact with the edge ring 732 through an opening 806 formed in the support ring 730. The edge ring 732 has a first surface 814 and a second surface 816 opposite the first surface 814. One or more cavities 808 (one is shown) may be formed in the second surface 816 of the edge ring 732. The support ring 730 may include a first surface 813 for supporting the edge ring 732 and a second surface 815 opposite the first surface 813. The second surface 815 may be in contact with the second surface 722 of the second portion 720 of the electrostatic chuck 712. Each push pin 733 may include a chamfered tip 810 positioned in a corresponding cavity 808 of the edge ring 732, and the chamfered tip 810 can constrain the movement of the edge ring 732 in a horizontal, or radial, direction. In addition, the movement in the horizontal, or radial, direction of the support ring 730 is constrained by the push pins 733 since the radial clearance of each push pin 733 inside the opening 806 is very small, such as between 0.0001 in and 0.0010 in, for example about 0.0005 in. The radial clearance of each push pin 733 inside the opening 812 of the sleeve 724 may be similar to the radial clearance of the push pin 733 inside the opening 806. To further constrain the movement of the edge ring 732 in the horizontal, or radial, direction, the support ring 730 may include an inner edge 804 adjacent to the first portion 716 of the electrostatic chuck 712. The inner edge 804 may have a greater thickness than the rest of the support ring 730. In other words, the inner edge 804 includes a surface 818 at a higher elevation than the first surface 813 of the support ring 730. The edge ring 732 may be positioned on the first surface 813 of the support ring 730, and an inner surface 820 of the edge ring 732 may be in contact with the inner edge 804 of the support ring 730. Thus, the edge ring 732 is prevented from shifting in the horizontal, or radial, direction relative to the support ring 730.

After processing a certain number of substrates inside of the process chamber 100, the edge ring 732 may erode, and the first surface 814 is not coplanar with a processing surface of a substrate, such as the substrate 802, disposed on the first portion 716 of the electrostatic chuck 712. The edge ring 732 may be lifted by the one or more push pins 733, such as three push pins 733, in order for the first surface 814 of the edge ring 732 to be coplanar with the processing surface of the substrate 802 disposed on the first portion 716 of the electrostatic chuck 712. Thus, the edge ring 732 may be supported by the one or more push pins 733 during processing. Since the radial clearance of each push pin 733 inside of the openings 806, 812 is small, the movement of the edge ring 732 in the horizontal, or radial, direction is constrained as the edge ring 732 is supported by the one or more push pins 733. Because the movement of the edge ring 732 in the horizontal, or radial, direction is constrained, the edge ring 732 is consistently positioned concentrically with respect to the first portion 716 of the electrostatic chuck 712. Since the substrate 802 is positioned concentrically with respect to the first portion 716 of the electrostatic chuck 712, the edge ring 732 is also consistently positioned concentrically with respect to the substrate 802 when the edge ring 732 is supported either by the support ring 730 or by the one or more push pins 733. Having the edge ring 732 consistently positioned concentrically with respect to the substrate 802 and the first surface 814 of the edge ring 732 being coplanar with the processing surface of the substrate 802 improves plasma uniformity across the processing surface of the substrate during processing.

Sometimes the substrate may suffer from an azimuthal non-uniformity near the edge of the substrate. In order to adjust the azimuthal edge process results, the edge ring 732 may be tilted by the one or more actuators 736 via the one or more push pins 733. The one or more actuators 736 may raise the one or more push pins 733 to different elevations, and the edge ring 732 is tilted with respect to the processing surface of the substrate 802. By titling the edge ring 732, i.e., causing the edge ring 732 to be non-coplanar with the processing surface of the substrate 802, the plasma sheath and/or chemistry in a specific location near the substrate edge is changed, and the azimuthal non-uniformity near the substrate edge is reduced.

In order to lift the edge ring 732 while the edge ring 732 is coplanar with the processing surface of the substrate 802, the one or more actuators 736 may be calibrated so the one or more push pins 733 are raised by the actuators 736 to the same elevation. One method of calibrating the actuators 736 is to slowly raise each push pin 733 until the person calibrating the actuators 736 feels each push pin 733 is slightly above the first surface 718 of the first portion 716 of the electrostatic chuck 712. Another method of calibrating the actuators 736 is to use an acoustic sensor to hear the contact of the push pins 733 against the edge ring 732, to use an accelerometer on the edge ring 732 to sense the contact, or to look at the servo position feedback (following error or servo torque) to sense the contact.

Another benefit of being able to raise the edge ring 732 is that the edge ring 732 can be raised to a high enough elevation such that a vacuum robot blade (not shown) can enter the process chamber via a slit valve beneath the edge ring 732 and remove the edge ring 732 from the process chamber without venting and opening the process chamber. The edge ring 732 may be removed from the process chamber by the vacuum robot after a number of substrates have been removed from the process chamber. A new edge ring 732 may be placed in the process chamber by the vacuum robot. The new edge ring 732 may be made of a different material or may have a different shape, in order to optimize results of a specific process. In addition, the ability to transfer edge ring 732 in and out of the process chamber without venting and opening the process chamber enables the process chamber to run longer between wet clean cycles which are expensive and cause lost productivity.

An exemplary process sequence for removing the edge ring 732 starts with lifting the edge ring 732 to an elevation above a substrate transfer plane by the one or more push pins 733, extending the vacuum robot blade into the process chamber at a location below the edge ring 732, lowering the edge ring 732 onto the vacuum robot blade by the one or more push pins 733, moving the vacuum robot blade with the edge ring 732 disposed thereon out of the process chamber and into a loadlock chamber (not shown), picking the edge ring 732 off of the vacuum robot blade by raising the loadlock chamber lift (not shown) or lowering the vacuum robot blade, venting the loadlock chamber, using a factory interface robot (not shown) to remove the edge ring 732 from the loadlock chamber, and putting the edge ring 732 in a storage location (the storage location could have multiple locations holding different or similar edge rings).

FIG. 8B is a schematic cross-sectional partial side view of a substrate support assembly 800 according to another example of the disclosure. As shown in FIG. 8B, the substrate support assembly 800 includes a process kit 801, the substrate support 705, and an electrostatic chuck 803. The process kit 801 may surround the electrostatic chuck 803. The electrostatic chuck 803 may include a first portion 805, a second portion 807 extending radially-outward from the first portion 805, and a third portion 830 extending radially-outward from the second portion 807. The second portion 807 has a surface 809, and the third portion 830 has a surface 832. The process kit 801 includes a cover ring 840, a support ring 850, and an edge ring 852. The sleeve 724 may include one or more cavities 844, and the cover ring 840 may include one or more protrusions 842. The support ring 850 may be disposed on the surface 832 of the third portion 830 of the electrostatic chuck 803, and a gap 811 may be formed between the support ring 850 and the sleeve 724. The support ring 850 may be disposed over a surface 843 of the sleeve 724. The support ring 850 may be fabricated from the same material as the support ring 730. One or more openings 860 may be formed in the support ring 850, and the one or more push pins 733 may be disposed through the openings 860. The edge ring 852 may be disposed on the second surface 809 of the second portion 807 of the electrostatic chuck 803. The edge ring 852 may be adjustable independently from the support ring 850. The edge ring 852 may be fabricated from the same material as the edge ring 732. The edge ring 852 may include one or more cavities 854 for engaging the chamfered tips 810 of the one or more push pins 733. The chamfered tips 810 can constrain the movement of the edge ring 852 in a horizontal, or radial, direction.

The support ring 850 may be tightly fitted between the second portion 807 of the electrostatic chuck 803 and the one or more protrusions 842 of the cover ring 840. The cover ring 840 may include a top surface 862, a first surface 864 opposite the top surface 862, a second surface 866 opposite the top surface 862, a third surface 868 opposite the top surface 862, and a fourth surface 870 opposite the top surface 862. The first surface 864 may be in contact with and supported by the support ring 850, while a gap is formed between surfaces 866, 868 and the sleeve 724 and between the surface 870 and the shield 728. The cover ring 840 may further include a fifth surface 872 connecting surfaces 866, 868 and a sixth surface 874 connecting surfaces 864, 866. Each cavity 844 of the one or more cavities of the sleeve 724 may include a first surface 876 and a second surface 878 opposite the first surface 876. Gaps formed between the first surface 876 and the fifth surface 872 and between the second surface 878 and the sixth surface 874 may be small, such as 0.01 in or less, which constrains the movement of the cover ring 840 in the horizontal, or radial, direction. Since the support ring 850 is tightly fitted between the sixth surface 874 of the cover ring 840 and the second portion 807 of the electrostatic chuck 803, the movement of the support ring 850 in the horizontal, or radial, direction is also constrained. The edge ring 852 may be consistently positioned concentrically with respect to the substrate (not shown) when the edge ring 852 is either supported by the second surface 809 of the electrostatic chuck 803 or by the one or more push pins 733. The edge ring 852 may be removed from the process chamber by the same method as removing the edge ring 732.

Figure 9:
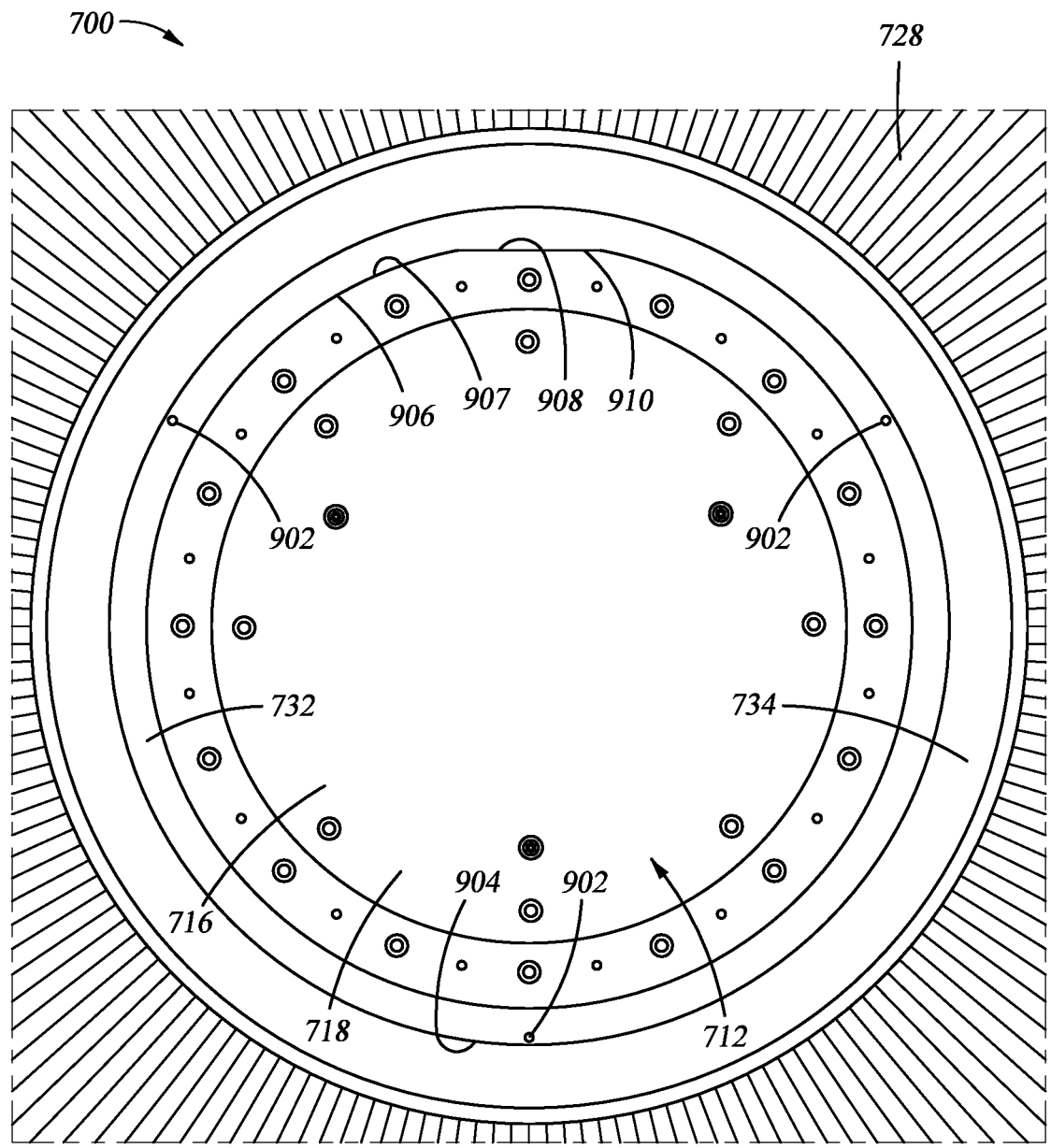
FIG. 9 is a schematic top view of the substrate support assembly of FIG. 7 according to one example of the disclosure.

FIG. 9 is a schematic top view of the substrate support assembly 700 of FIG. 7 according to one example of the disclosure. As shown in FIG. 9, the substrate support assembly 700 includes the electrostatic chuck 712 having the first portion 716 with the surface 718, which is surrounded by the edge ring 732 (or 852), which is surrounded by the cover ring 734 (or 840). The shield 728 surrounds the sleeve 724 (FIGS. 8A and 8B). The edge ring 732 (or 852) may be raised by the one or more push pins 733 (FIGS. 8A-8B) at locations 902. In one example, there are three push pins 733 for raising the edge ring 732 (or 852) at three locations 902. The locations 902, or the push pins 733, may be 120 degrees apart and may have the same radial distance on the edge ring 732 (or 852), as shown in FIG. 9. The edge ring 732 (or 852) may have an outer edge 904 and an inner edge 906. The inner edge 906 may include a first portion 907 and second portion 908. The outer edge 904 may be substantially circular. The first portion 907 of the inner edge 906 may be substantially circular and may be substantially parallel to the outer edge 904. The second portion 908 of the inner edge 906 may be substantially linear and may not be substantially parallel to the outer edge 904. The second portion 908 may conform to a linear section 910 on the electrostatic chuck 712 for locking with the electrostatic chuck 712.

Figure 10A:
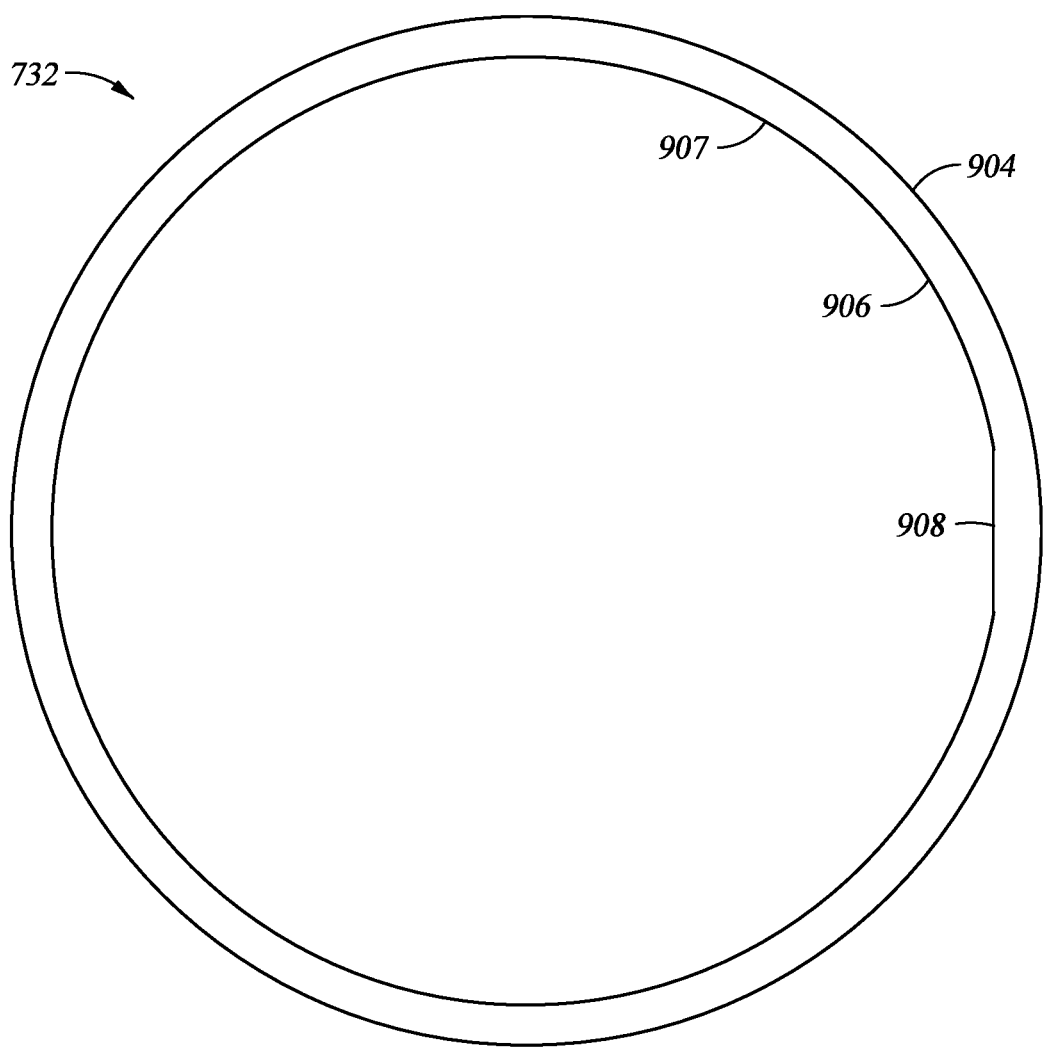
FIG. 10A is a schematic top view of an edge ring according to one example of the disclosure.

FIG. 10A is a schematic top view of the edge ring 732 (or 852) according to one example of the disclosure. As shown in FIG. 10A, the edge ring 732 (or 852) includes the outer edge 904, the inner edge 906, and the second portion 908. The distance between the outer edge 904 and the inner edge 906 (i.e., the width) may vary in order to optimize different processes or process chemistries. The radius of the edge ring 732 (or 852) may also vary depending on the radius of the electrostatic chuck.

Figure 10B:
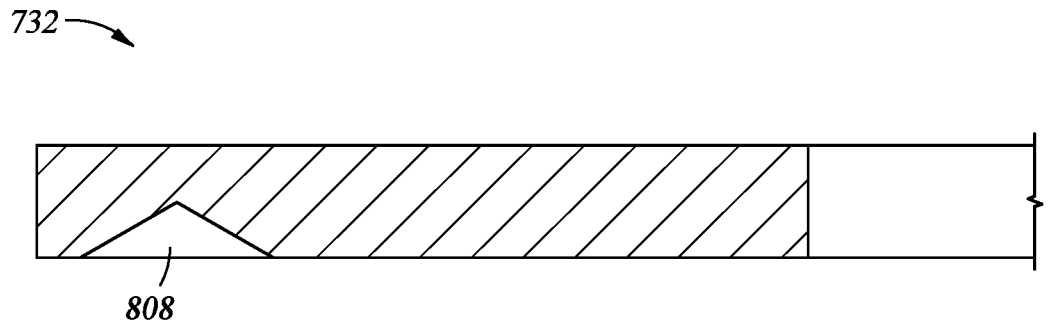
FIG. 10B is a schematic side view of a portion of the edge ring of FIG. 10A according to one example of the disclosure.

FIG. 10B is a schematic side view of a portion of the edge ring 732 (or 852) of FIG. 10A according to one example of the disclosure. As shown in FIG. 10B, the edge ring 732 (or 852) includes one or more cavities 808 (or 854) for engaging with the chamfered tip 810 of the one or more push pins 733. The cavities 808 (or 854) may have any suitable shape. In one example, each cavity 808 (or 854) has a tapered V shape, as shown in FIG. 10B.

Figure 11A:
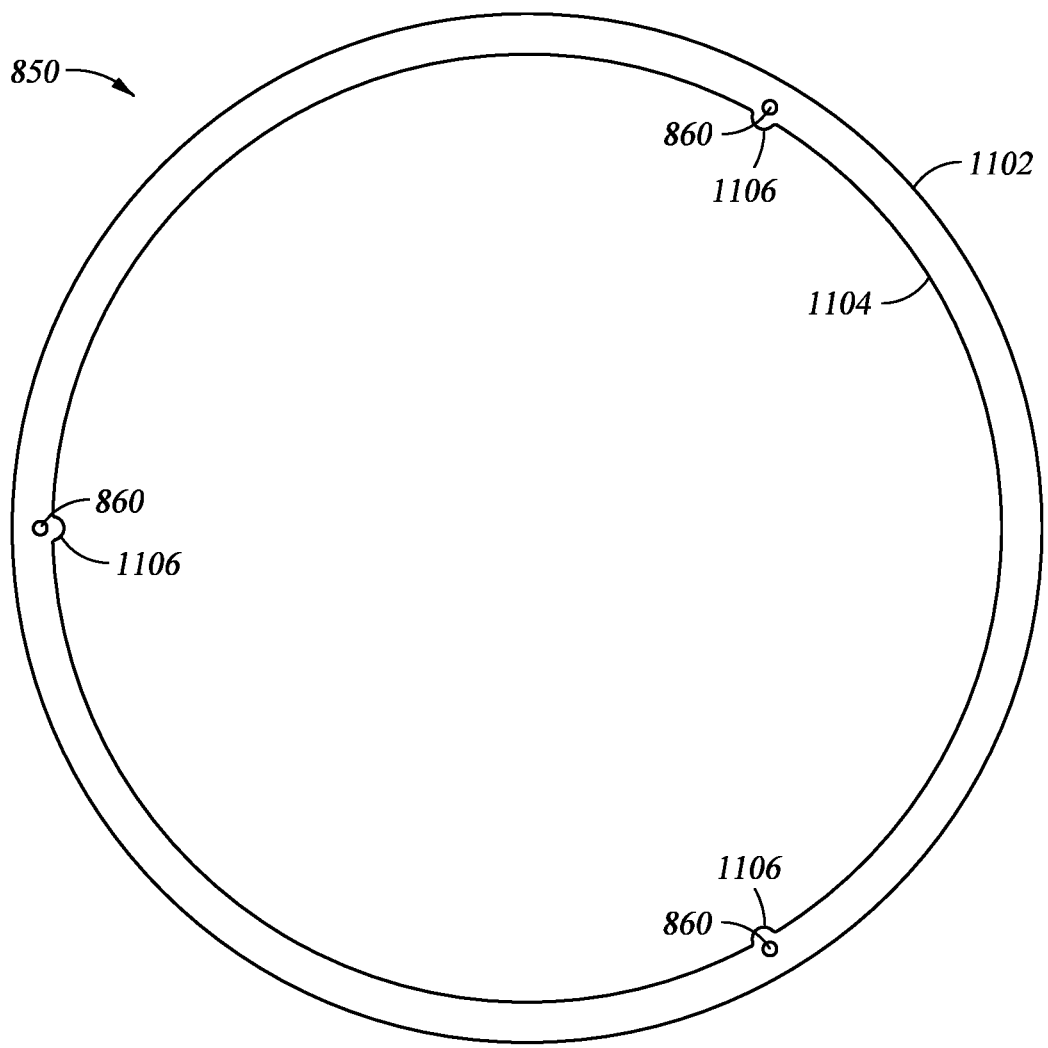
FIG. 11A is a schematic top view of a support ring according to one example of the disclosure.

FIG. 11A is a schematic top view of the support ring 850 according to one example of the disclosure. As shown in FIG. 11A, the support ring 850 (or 730 shown in FIG. 8A) includes an outer edge 1102, an inner edge 1104, and the one or more openings 860 (or 806 shown in FIG. 8A). In one example, there are three openings 860, as shown in FIG. 11A, and the openings 860 are formed at locations between the outer edge 1102 and the inner edge 1104. The distance between the outer edge 1102 and the inner edge 1104 (i.e., the width) may vary in order to optimize different processes or process chemistries. The radius of the support ring 850 may also vary depending on the radius of the electrostatic chuck.

Figure 11B:
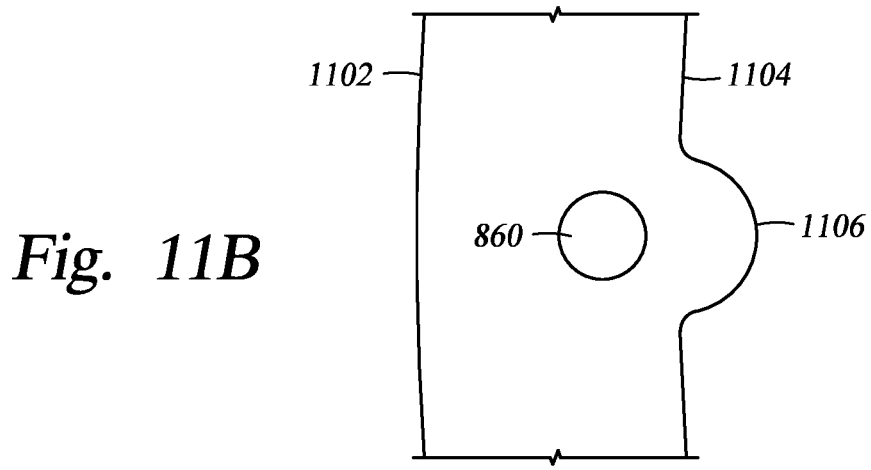
FIG. 11B is an enlarged schematic top view of a portion of the support ring of FIG. 11A according to one example of the disclosure.

FIG. 11B is an enlarged schematic top view of a portion of the support ring 850 of FIG. 11A according to one example of the disclosure. As shown in FIG. 11B, the inner edge 1104 may optionally include one or more protrusions 1106. The one or more protrusions 1106 may be located adjacent to the one or more openings 860. The one or more protrusions 1106 are used to maintain concentricity with respect to the electrostatic chuck 712 in the event both the electrostatic chuck 712 and the support ring 850 are thermally expanded during processing.

Figure 12:
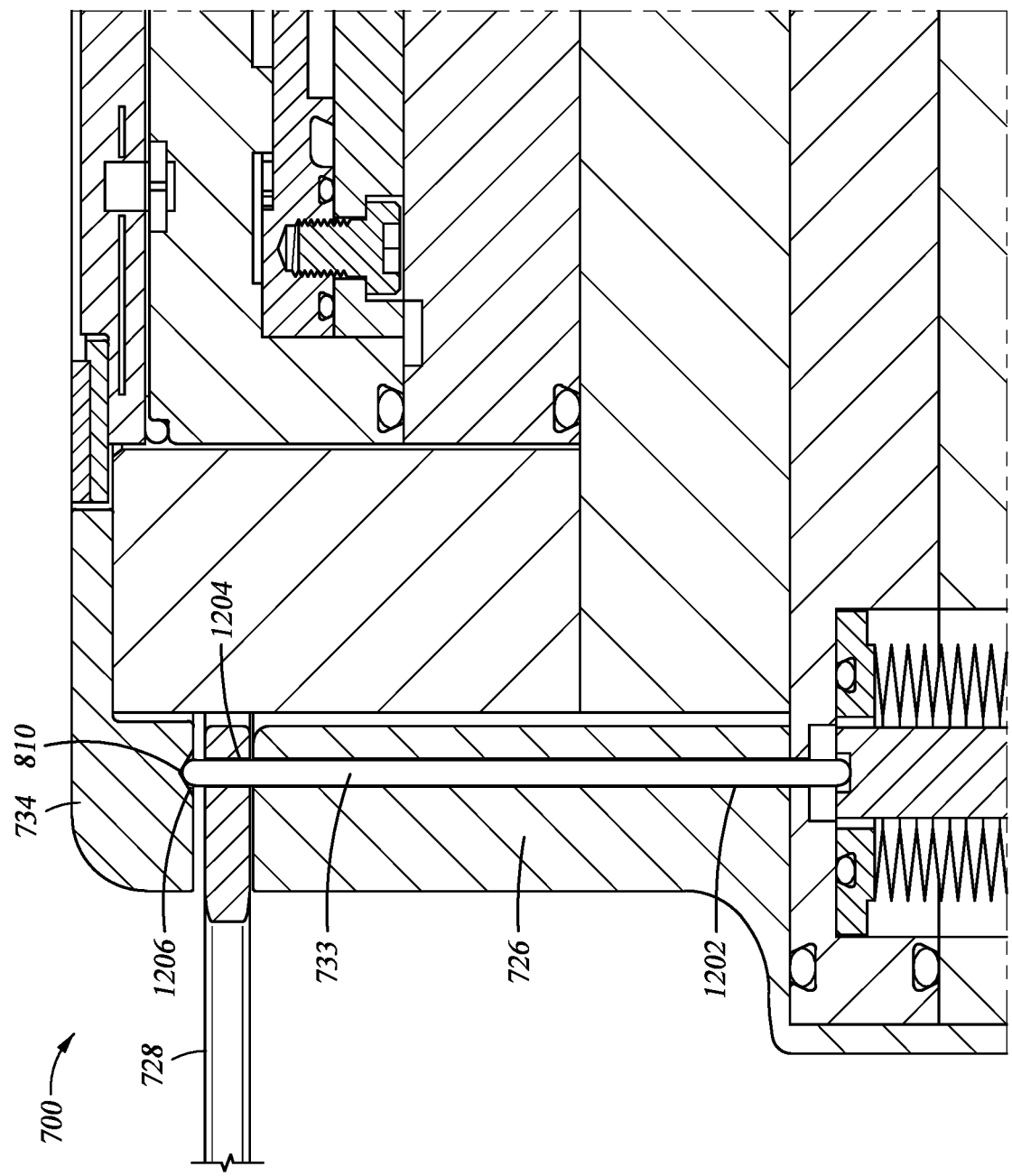
FIG. 12 is a schematic cross-sectional partial side view of a substrate support assembly according to another example of the disclosure.

FIG. 12 is a schematic cross-sectional partial side view of the substrate support assembly 700 according to another example of the disclosure. As shown in FIG. 12, the one or more push pins 733 may be located through an opening 1202 formed in the cathode liner 726 and through an opening 1204 formed in the shield 728. The cover ring 734 may include one or more cavities 1206 for engaging the chamfered tip 810 of the one or more push pins 733. The one or more push pins 733 can raise or tilt the cover ring 734 in the same fashion as raising the edge ring 732 or 852. In one example, one or more push pins 733 are utilized to raise or tilt both the cover ring 734 and the edge ring 732 or 852 to improve plasma uniformity across the processing surface of the substrate.

Examples of the present disclosure result in increased plasma uniformity across the surface of a substrate being processed in a process chamber. Since there is a direct correlation between plasma uniformity and process yield, the increased plasma uniformity leads to an increase in process yield. Furthermore, process chambers making use of the present disclosure experience less downtime for preventative maintenance by extending the usable life of edge rings.

While the foregoing is directed to examples of the present disclosure, other and further examples of the disclosure may be devised without departing from the basic scope thereof, and the scope thereof is determined by the claims that follow.

What is claimed is:

1. A process kit for processing a substrate, the process kit comprising:
a support ring comprising an upper surface having a radially inner edge disposed at a first height and a radially outward edge disposed at a second height less than the first height, the radially inner edge having a greater thickness than the radially outward edge;
an edge ring disposed directly on the radially outward edge of the support ring, an inner surface of the edge ring interfaced with the radially inner edge of the support ring;
a cover ring disposed radially outward of the edge ring, the edge ring independently moveable relative to the support ring and the cover ring; and
one or more push pins disposed radially inward of an inner diameter of the cover ring, the one or more push pins being operable to elevate the edge ring, wherein movement in a radial direction of the support ring is constrained by the one or more push pins.

2. The process kit of claim 1, wherein the cover ring is fabricated from quartz.

3. The process kit of claim 1, further comprising:
an actuating mechanism including the one or more push pins configured to actuate the edge ring such that a distance between a bottom surface of the edge ring and the radially outward edge of the support ring is varied.

4. The process kit of claim 1, wherein the one or more push pins are fabricated from quartz.

5. The process kit of claim 1, further comprising:
an annular sleeve disposed radially outward of the support ring and below the edge ring.

6. The process kit of claim 5, wherein a gap is formed between the support ring and the annular sleeve.

7. An apparatus for processing a substrate, the apparatus comprising:
an electrostatic chuck having a first portion and a second portion, the first portion configured to support the substrate;
a process kit configured to interface with the second portion of the electrostatic chuck, the process kit comprising:
a support ring comprising an upper surface having a radially inner edge disposed at a first height and a radially outward edge disposed at a second height less than the first height, the radially inner edge having a greater thickness than the radially outward edge;
an edge ring disposed directly on the support ring, an inner surface of the edge ring interfaced with the radially inner edge of the support ring;
a cover ring disposed radially outward of the edge ring, the edge ring independently moveable relative to the support ring and the cover ring; and
one or more push pins disposed radially inward of an inner diameter of the cover ring, the one or more push pins being operable to elevate the edge ring, wherein movement in a radial direction of the support ring is constrained by the one or more push pins.

8. The apparatus of claim 7, further comprising:
an annular sleeve disposed below the edge ring and circumscribing at least the support ring, wherein a gap is formed between the support ring and the annular sleeve.

9. The apparatus of claim 7, wherein the one or more push pins are interfaced with a bottom surface of the edge ring, the one or more push pins configured to actuate the edge ring such that a distance between the bottom surface of the edge ring and the radially outward edge of the support ring is varied.

10. The apparatus of claim 7, wherein a bottom surface of the edge ring is disposed above a bottom surface of both the radially inner edge and the radially outward edge of the support ring when the edge ring is in a lowermost position.

* * * * *